(12) United States Patent
Prager et al.

(10) Patent No.: US 11,646,176 B2
(45) Date of Patent: *May 9, 2023

(54) EFFICIENT NANOSECOND PULSER WITH SOURCE AND SINK CAPABILITY FOR PLASMA CONTROL APPLICATIONS

(71) Applicant: Eagle Harbor Technologies, Inc., Seattle, WA (US)

(72) Inventors: James Prager, Seattle, WA (US); Timothy Ziemba, Bainbridge Island, WA (US); Kenneth Miller, Seattle, WA (US); Ilia Slobodov, Seattle, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/033,662

(22) Filed: Sep. 25, 2020

(65) Prior Publication Data

US 2021/0013011 A1 Jan. 14, 2021

Related U.S. Application Data

(63) Continuation of application No. 16/736,971, filed on Jan. 8, 2020, now Pat. No. 10,796,887.
(Continued)

(51) Int. Cl.
*H01J 37/32* (2006.01)
*H03K 17/0424* (2006.01)
*H02M 3/335* (2006.01)

(52) U.S. Cl.
CPC .. *H01J 37/32091* (2013.01); *H01J 37/32174* (2013.01); *H01J 37/32348* (2013.01); *H03K 17/0424* (2013.01); *H02M 3/335* (2013.01)

(58) Field of Classification Search
CPC .......... H01J 37/32174; H01J 37/32091; H01J 37/32348; H01J 37/32146;
(Continued)

(56) References Cited

U.S. PATENT DOCUMENTS 4,070,589 A 1/1978 Martinkovic
4,438,331 A 3/1984 Davis
(Continued)

FOREIGN PATENT DOCUMENTS

CA 2292526 A1 12/1999
CN 101534071 A 9/2009
(Continued)

OTHER PUBLICATIONS

Bland, M.J., et al., "A High Power RF Power Supply for High Energy Physics Applications," Proceedings of 2005 the Particle Accelerator Conference, IEEE pp. 4018-4020 (May 16-20, 2005).
(Continued)

*Primary Examiner* — Wei (Victor) Y Chan

(57) ABSTRACT

Some embodiments include a high voltage, high frequency switching circuit. In some embodiments, the high voltage, high frequency switching circuit includes a high voltage switching power supply that produces pulses having a voltage greater than 1 kV and with frequencies greater than 10 kHz; a transformer having a primary side and secondary side; an output electrically coupled with the secondary side of the transformer; and a primary sink electrically coupled with the primary side of the transformer and in parallel with the high voltage switching power supply, the primary sink comprising at least one resistor that discharges a load coupled with the output,?

22 Claims, 11 Drawing Sheets

Related U.S. Application Data

(60) Provisional application No. 62/789,523, filed on Jan. 8, 2019, provisional application No. 62/789,526, filed on Jan. 8, 2019.

(58) Field of Classification Search
CPC .......... H01J 2237/2485; H01J 37/241; H01J 37/321; H01J 37/3467; H01J 37/32082; H01J 37/32128; H01J 37/32183; H01J 37/32541; H01J 37/32568; H01J 37/32623; H01J 37/32697; H01J 37/32715; H01J 37/32761
See application file for complete search history.

(56) References Cited

U.S. PATENT DOCUMENTS

| | | | |
|---|---|---|---|
| 4,504,895 A | 3/1985 | Steigerwald | |
| 4,885,074 A | 12/1989 | Susko et al. | |
| 4,924,191 A | 5/1990 | Erb et al. | |
| 4,992,919 A | 2/1991 | Lee et al. | |
| 5,072,191 A | 12/1991 | Nakajima et al. | |
| 5,118,969 A | 6/1992 | Ikezi et al. | |
| 5,140,510 A | 8/1992 | Myers | |
| 5,313,481 A | 5/1994 | Cook et al. | |
| 5,321,597 A | 6/1994 | Alacoque | |
| 5,325,021 A | 6/1994 | Duckworth et al. | |
| 5,392,043 A | 2/1995 | Ribner | |
| 5,418,707 A * | 5/1995 | Shimer | H02H 7/00 363/55 |
| 5,451,846 A | 9/1995 | Peterson et al. | |
| 5,488,552 A | 1/1996 | Sakamoto et al. | |
| 5,610,452 A | 3/1997 | Shimer et al. | |
| 5,623,171 A | 4/1997 | Nakajima | |
| 5,656,123 A | 8/1997 | Salimian et al. | |
| 5,729,562 A | 3/1998 | Birx et al. | |
| 5,796,598 A | 8/1998 | Nowak et al. | |
| 5,808,504 A | 9/1998 | Chikai et al. | |
| 5,905,646 A | 5/1999 | Crewson et al. | |
| 5,930,125 A | 7/1999 | Hitchcock et al. | |
| 5,933,335 A | 8/1999 | Hitchcock et al. | |
| 5,968,377 A | 10/1999 | Yuasa et al. | |
| 6,059,935 A | 5/2000 | Spence | |
| 6,066,901 A | 5/2000 | Burkhart et al. | |
| 6,087,871 A | 7/2000 | Kardo-Syssoev et al. | |
| 6,205,074 B1 | 3/2001 | Van Buskirk et al. | |
| 6,233,161 B1 | 5/2001 | Balakrishnan et al. | |
| 6,238,387 B1 | 5/2001 | Miller, III | |
| 6,253,704 B1 | 7/2001 | Savas | |
| 6,359,542 B1 | 3/2002 | Widmayer et al. | |
| 6,362,604 B1 | 3/2002 | Cravey | |
| 6,392,187 B1 | 5/2002 | Johnson | |
| 6,416,638 B1 * | 7/2002 | Kuriyama | C23C 14/54 204/298.03 |
| 6,480,399 B2 | 11/2002 | Balakrishnan et al. | |
| 6,483,731 B1 | 11/2002 | Isurin et al. | |
| 6,496,047 B1 | 12/2002 | Iskander et al. | |
| 6,577,135 B1 | 6/2003 | Matthews et al. | |
| 6,741,120 B1 | 5/2004 | Tan | |
| 6,741,484 B2 | 5/2004 | Crewson et al. | |
| 6,831,377 B2 | 12/2004 | Yampolsky et al. | |
| 6,897,574 B2 | 5/2005 | Vaysse | |
| 6,947,300 B2 | 9/2005 | Pai et al. | |
| 7,061,230 B2 | 6/2006 | Kleine et al. | |
| 7,180,082 B1 | 2/2007 | Hassanein et al. | |
| 7,256,637 B2 | 8/2007 | Iskander et al. | |
| 7,291,545 B2 | 11/2007 | Collins et al. | |
| 7,307,375 B2 | 12/2007 | Smith et al. | |
| 7,319,579 B2 | 1/2008 | Inoue et al. | |
| 7,354,501 B2 | 4/2008 | Gondhalekar et al. | |
| 7,396,746 B2 | 7/2008 | Walther et al. | |
| 7,492,138 B2 | 2/2009 | Zhang et al. | |
| 7,512,433 B2 | 3/2009 | Bernhart et al. | |
| 7,521,370 B2 | 4/2009 | Hoffman | |
| 7,601,619 B2 | 10/2009 | Okumura et al. | |
| 7,605,385 B2 | 10/2009 | Bauer | |
| 7,767,433 B2 | 8/2010 | Kuthi et al. | |
| 7,901,930 B2 | 3/2011 | Kuthi et al. | |
| 7,936,544 B2 | 5/2011 | Beland | |
| 7,948,185 B2 | 5/2011 | Smith et al. | |
| 7,989,987 B2 | 8/2011 | McDonald | |
| 8,093,979 B2 | 1/2012 | Wilson | |
| 8,115,343 B2 | 2/2012 | Sanders et al. | |
| 8,129,653 B2 | 3/2012 | Kirchmeier et al. | |
| 8,143,790 B2 | 3/2012 | Smith et al. | |
| 8,222,936 B2 | 7/2012 | Friedman et al. | |
| 8,259,476 B2 | 9/2012 | Ben-Yaakov et al. | |
| 8,410,889 B2 | 4/2013 | Garrity et al. | |
| 8,436,602 B2 | 5/2013 | Sykes | |
| 8,450,985 B2 | 5/2013 | Gray et al. | |
| 8,575,843 B2 | 11/2013 | Moore et al. | |
| 8,723,591 B2 | 5/2014 | Lee et al. | |
| 8,773,184 B1 | 7/2014 | Petrov et al. | |
| 8,828,254 B2 | 9/2014 | Inoue et al. | |
| 8,847,433 B2 | 9/2014 | Vandermey | |
| 8,963,377 B2 | 2/2015 | Ziemba et al. | |
| 9,067,788 B1 | 6/2015 | Spielman et al. | |
| 9,070,396 B1 | 6/2015 | Katchmart et al. | |
| 9,084,334 B1 | 7/2015 | Gefter et al. | |
| 9,122,350 B2 | 9/2015 | Kao et al. | |
| 9,287,086 B2 | 3/2016 | Brouk et al. | |
| 9,287,092 B2 | 3/2016 | Brouk et al. | |
| 9,306,533 B1 | 4/2016 | Mavretic | |
| 9,329,256 B2 | 5/2016 | Dolce | |
| 9,349,603 B2 | 5/2016 | Inoue et al. | |
| 9,417,739 B2 | 8/2016 | Cordeiro et al. | |
| 9,435,029 B2 | 9/2016 | Brouk et al. | |
| 9,493,765 B2 | 11/2016 | Krishnaswamy et al. | |
| 9,601,283 B2 | 3/2017 | Ziemba et al. | |
| 9,706,630 B2 | 7/2017 | Miller et al. | |
| 9,767,988 B2 | 9/2017 | Brouk et al. | |
| 9,960,763 B2 | 5/2018 | Miller et al. | |
| 10,009,024 B2 | 6/2018 | Gan et al. | |
| 10,020,800 B2 | 7/2018 | Prager et al. | |
| 10,027,314 B2 | 7/2018 | Prager et al. | |
| 10,044,278 B2 | 8/2018 | Kondo et al. | |
| 10,224,822 B2 | 3/2019 | Miller et al. | |
| 10,301,587 B2 | 5/2019 | Krishnaswamy et al. | |
| 10,304,661 B2 | 5/2019 | Ziemba et al. | |
| 10,373,755 B2 | 8/2019 | Prager et al. | |
| 10,373,804 B2 | 8/2019 | Koh et al. | |
| 10,382,022 B2 | 8/2019 | Prager et al. | |
| 10,448,494 B1 | 10/2019 | Dorf et al. | |
| 10,448,495 B1 | 10/2019 | Dorf et al. | |
| 10,460,910 B2 | 10/2019 | Ziemba et al. | |
| 10,460,911 B2 | 10/2019 | Ziemba et al. | |
| 10,483,089 B2 | 11/2019 | Ziemba et al. | |
| 10,555,412 B2 | 2/2020 | Dorf et al. | |
| 10,600,619 B2 | 3/2020 | Inoue et al. | |
| 10,607,814 B2 | 3/2020 | Ziemba et al. | |
| 10,659,019 B2 | 5/2020 | Slobodov et al. | |
| 10,707,864 B2 | 7/2020 | Miller et al. | |
| 10,734,906 B2 | 8/2020 | Miller et al. | |
| 10,777,388 B2 | 9/2020 | Ziemba et al. | |
| 10,791,617 B2 | 9/2020 | Dorf et al. | |
| 10,796,887 B2 | 10/2020 | Prager et al. | |
| 10,811,230 B2 | 10/2020 | Ziemba et al. | |
| 10,892,140 B2 | 1/2021 | Ziemba et al. | |
| 10,892,141 B2 | 1/2021 | Ziemba et al. | |
| 10,978,955 B2 | 4/2021 | Ziemba et al. | |
| 11,004,660 B2 | 5/2021 | Prager et al. | |
| 11,171,568 B2 | 11/2021 | Miller et al. | |
| 11,284,500 B2 | 3/2022 | Dorf et al. | |
| 2001/0008552 A1 | 7/2001 | Harada et al. | |
| 2002/0016617 A1 | 2/2002 | Oldham | |
| 2002/0140464 A1 | 10/2002 | Yampolsky et al. | |
| 2002/0180276 A1 | 12/2002 | Sakuma et al. | |
| 2002/0186577 A1 | 12/2002 | Kirbie | |
| 2003/0021125 A1 | 1/2003 | Rufer et al. | |
| 2003/0071035 A1 | 4/2003 | Brailove | |
| 2003/0137791 A1 | 7/2003 | Arnet et al. | |
| 2003/0169107 A1 | 9/2003 | LeChevalier | |
| 2003/0227280 A1 | 12/2003 | Vinciarelli | |
| 2004/0085784 A1 | 5/2004 | Salama et al. | |

(56) References Cited

U.S. PATENT DOCUMENTS

| | | |
|---|---|---|
| 2004/0149217 A1 | 8/2004 | Collins et al. |
| 2005/0152159 A1 | 7/2005 | Isurin et al. |
| 2005/0270096 A1 | 12/2005 | Coleman |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2008/0062733 A1 | 3/2008 | Gay |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0108759 A1 | 4/2009 | Tao et al. |
| 2009/0322307 A1 | 12/2009 | Ide |
| 2010/0007358 A1 | 1/2010 | Schaerrer et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0140607 A1 | 6/2011 | Moore et al. |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0155613 A1 | 6/2012 | Caiafa et al. |
| 2013/0027848 A1 | 1/2013 | Said |
| 2013/0029492 A1 | 1/2013 | Inoue et al. |
| 2013/0075390 A1 | 3/2013 | Ashida |
| 2013/0113650 A1 | 5/2013 | Behbahani et al. |
| 2013/0146443 A1* | 6/2013 | Papa ............... H01J 37/3467 |
| | | 204/192.16 |
| 2013/0174105 A1 | 7/2013 | Nishio et al. |
| 2013/0175575 A1 | 7/2013 | Ziemba et al. |
| 2013/0320953 A1 | 12/2013 | Cassel et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1* | 4/2014 | Singleton ............... F02P 3/02 |
| | | 315/52 |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0349418 A1 | 11/2014 | Inoue et al. |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0155086 A1 | 6/2015 | Matsuura |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020072 A1 | 1/2016 | Brouk et al. |
| 2016/0220670 A1 | 8/2016 | Kalghatgi et al. |
| 2016/0225587 A1 | 8/2016 | Inoue et al. |
| 2016/0241234 A1 | 8/2016 | Mavretic |
| 2016/0269195 A1 | 9/2016 | Coenen et al. |
| 2016/0327029 A1 | 11/2016 | Ziemba et al. |
| 2016/0327089 A1 | 11/2016 | Adam et al. |
| 2017/0083810 A1 | 3/2017 | Ielmini et al. |
| 2017/0126049 A1 | 5/2017 | Pan et al. |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0359886 A1 | 12/2017 | Binderbauer et al. |
| 2018/0226896 A1 | 8/2018 | Miller et al. |
| 2018/0286636 A1 | 10/2018 | Ziemba et al. |
| 2018/0315581 A1* | 11/2018 | Hayami ............... H01L 21/3065 |
| 2018/0315583 A1 | 11/2018 | Luere et al. |
| 2018/0374689 A1 | 12/2018 | Abraham et al. |
| 2019/0080884 A1 | 3/2019 | Ziemba et al. |
| 2019/0088518 A1* | 3/2019 | Koh ..................... C23C 16/505 |
| 2019/0131110 A1 | 5/2019 | Ziemba et al. |
| 2019/0157044 A1 | 5/2019 | Ziemba et al. |
| 2019/0172685 A1 | 6/2019 | Van Zyl et al. |
| 2019/0180982 A1 | 6/2019 | Brouk et al. |
| 2019/0228952 A1 | 7/2019 | Dorf et al. |
| 2019/0326092 A1 | 10/2019 | Ogasawara et al. |
| 2019/0348258 A1 | 11/2019 | Koh et al. |
| 2019/0350072 A1* | 11/2019 | Dorf .................. H01J 37/3438 |
| 2019/0393791 A1 | 12/2019 | Ziemba et al. |
| 2020/0035458 A1 | 1/2020 | Ziemba et al. |
| 2020/0043702 A1 | 2/2020 | Ziemba et al. |
| 2020/0051786 A1 | 2/2020 | Ziemba et al. |
| 2020/0154556 A1 | 5/2020 | Dorf et al. |
| 2020/0161092 A1 | 5/2020 | Inoue et al. |
| 2020/0168436 A1 | 5/2020 | Ziemba et al. |
| 2020/0352017 A1 | 11/2020 | Dorf et al. |
| 2020/0378605 A1* | 12/2020 | Lacoste .................. F02C 5/00 |
| 2020/0396820 A1* | 12/2020 | de Vries .................. A61N 1/44 |
| 2021/0152163 A1 | 5/2021 | Miller et al. |

FOREIGN PATENT DOCUMENTS

| | | |
|---|---|---|
| CN | 103458600 B | 7/2016 |
| CN | 106537776 A | 3/2017 |
| EP | 174164 A2 | 3/1986 |
| EP | 0947048 A1 | 10/1999 |
| EP | 1128557 A2 | 8/2001 |
| EP | 1515430 A1 | 3/2005 |
| JP | H09129621 A | 5/1997 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2018186901 A1 | 10/2018 |

OTHER PUBLICATIONS

Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).

Garwin, R., "Pulsed Power Peer Review Committee Report," Sandia National Laboratories Report, SAND2000-2515, pp. 3-38 (Oct. 2000).

Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).

Goodman, E. A., "Characteristics of sheet windings in transformers", IEEE Engineering, vol. 82, No. 11, pp. 673-676 (Nov. 1963) (Abstract).

In, Y., et al., "On the roles of direct feedback and error field correction in stabilizing resistive-wall modes," Nuclear 2 Fusion, vol. 50, No. 4, pp. 1-5 (2010).

Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).

Locher, R., "Introduction to Power MOSFETs and their Applications (Application Note 558)," Fairchild Semiconductor, 15 pages (Oct. 1998).

Locher, R.E., and Pathak, A.D., "Use of BiMOSFETs in Modem Radar Transmitters," IEEE International Conference on Power Electronics and Drive Systems, pp. 776-782 (2001).

Pokryvailo, A., et al., "A 1KW Pulsed Corona System for Pollution Control Applications," 14th IEEE International Pulsed Power Conference, Dallas, TX, USA (Jun. 15-18, 2003).

Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).

Quinley, M., et al., "High Voltage Nanosecond Pulser Operating at 30 kW and 400 kHz" APS-GEC-2018, 1 page (2018).

(56) References Cited

OTHER PUBLICATIONS

Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modem Pulsed Power: Charlie Martin and Beyond," Proceedings of the IEEE, vol. 92, No. 7, pp. 1014-1020 (Jul. 2004).
Scoville, J.T., et al., "The Resistive Wall Mode Feedback Control System on Dlll-D," IEEE/NPSS 18th Symposium an fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions an Dielectrics and Electrical Insulation, vol. 18, No. 4, pp. 1084-1090 (Aug. 2011) (Abstract).
Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, dated Sep. 15, 2014, 10 pages.
International Search Report and Written Opinion as issued in connection with International Patent Application No. PCT/US2014/065832, dated Feb. 20, 2015, 13 pages.
International Search Report and Written Opinion as issued in connection with International Patent Application No. PCT/US2015/018349, dated Jul. 14, 2015, 15 pages.
International Search Report and Written Opinion as issued in connection with International Patent Application No. PCT/US2015/040204, dated Oct. 6, 2015, 12 pages.
U.S. Non-Final Office Action in U.S. Appl. No. 14/542,487 dated Nov. 23, 2015, 11 pages.
U.S. Non-Final Office Action in U.S. Appl. No. 14/798,154 dated Jan. 5, 2016, 13 pages.
U.S. Final Office Action in U.S. Appl. No. 14/542,487 dated Feb. 12, 2016, 11 pages.
U.S. Non-Final Office Action in U.S. Appl. No. 14/542,487 dated Apr. 8, 2016, 12 pages.
U.S. Non Final Office Action in U.S. Appl. No. 14/635,991, dated Jul. 29, 2016, 17 pages.
U.S. Final Office Action in U.S. Appl. No. 14/798,154 dated Oct. 6, 2016, 14 pages.
U.S. Final Office Action in U.S. Appl. No. 14/542,487 dated Dec. 12, 2016, 13 pages.
U.S. Final Office Action in U.S. Appl. No. 14/635,991, dated Jan. 23, 2017, 22 pages.
U.S. Notice of Allowance in U.S. Appl. No. 14/635,991, dated May 4, 2017, 07 pages.
U.S. Non-Final Office Action in U.S. Appl. No. 14/798,154 dated May 26, 2017, 16 pages.
U.S. Non-Final Office Action in U.S. Appl. No. 14/542,487 dated Jun. 5, 2017, 12 pages.
Partial Supplementary European Search Report in related foreign application No. 14861818.4, 12 Pages.
U.S. Non Final Office Action in U.S. Appl. No. 15/623,464, dated Nov. 7, 2017, 18 pages.
U.S. Final Office Action in U.S. Appl. No. 14/542,487 dated Dec. 19, 2017, 07 pages.
U.S. Final Office Action in U.S. Appl. No. 14/798,154 dated Dec. 28, 2017, 06 pages.
U.S. Notice of Allowance in U.S. Appl. No. 14/542,487 dated Mar. 21, 2018, 05 pages.
U.S. Final Office Action in U.S. Appl. No. 15/623,464, dated Mar. 27, 2018, 18 pages.
International Search Report and Written Opinion as issued in connection with International Patent Application No. PCT/US2018/016993, dated Apr. 18, 2018, 11 pages.
U.S. Notice of Allowance in U.S. Appl. No. 14/798,154 dated Jun. 1, 2018, 05 pages.
International Search Report and Written Opinion as issued in connection with International Patent Application No. PCT/US2018/025440, dated Jun. 25, 2018, 25 pages.
U.S. Notice of Allowance in U.S. Appl. No. 15/623,464, dated Oct. 17, 2018, 7 pages.
U.S. Non Final Office Action in U.S. Appl. No. 15/941,731, dated Nov. 16, 2018, 17 pages.
U.S. Non-Final Office Action in U.S. Appl. No. 15/921,650 dated Nov. 28, 2018, 11 pages.
U.S. Non Final Office Action in U.S. Appl. No. 16/178,538, dated Jan. 11, 2019, 27 pages.
U.S. Non Final Office Action in U.S. Appl. No. 16/250,765, dated Mar. 29, 2019, 11 pages.
U.S. Notice of Allowance in U.S. Appl. No. 15/921,650 dated Apr. 4, 2019, 7 pages.
International Search Report and Written Opinion as issued in connection with International Patent Application No. PCT/US2019/043933, dated Oct. 25, 2019, 9 pages.
International Search Report and Written Opinion as issued in connection with International Patent Application No. PCT/US2019/043988, dated Dec. 10, 2019, 13 pages.
U.S. Non Final Office Action in U.S. Appl. No. 16/250,157 dated Dec. 19, 2019, 6 pages.
International Search Report and Written Opinion as issued in connection with International Patent Application No. PCT/US2020/016253, dated Apr. 29, 2020, 7 pages.
U.S. Notice of Allowance in U.S. Appl. No. 16/250,157 dated Apr. 13, 2020, 8 pages.
International Search Report and Written Opinion as issued in connection with International Patent Application No. PCT/US2020/012641, dated May 28, 2020, 15 pages.
U.S. Non Final Office Action in U.S. Appl. No. 16/537,513, dated Sep. 3, 2020, 13 pages.
Prager, J.R. et al., "A High Voltage Nanosecond Pulser with Variable Pulse Width and Pulse Repetition Frequency control for Nonequilibrium Plasma Applications", 41st International Conference on Plasma Sciences held with 2014 IEEE International Conference on High-Power Particle Beams, May 25-29, 2014, 6, Washington, D.C.
Advisory Action in U.S. Appl. No. 14/542,487 dated Mar. 28, 2017, 03 pages.
Non-Final Office Action in U.S. Appl. No. 15/889,586 dated Sep. 12, 2018, 18 pages.
International Search Report and Written Opinion as issued in connection with International Patent Application No. PCT/US2018/48206, dated Nov. 1, 2018, 10 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.

(56) References Cited

OTHER PUBLICATIONS

Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, dated Dec. 5, 2019, 16 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Notice of Allowance in U.S. Appl. No. 15/945,722, dated Apr. 3, 2020, 7 pages.
Notice of Allowance in U.S. Appl. No. 16/114,195, dated Apr. 3, 2019, 9 pages.
Non-Final Office Action in U.S. Appl. No. 16/736,971, dated Apr. 7, 2020, 14 pages.
Non-Final Office Action in U.S. Appl. No. 16/457,791 dated Apr. 15, 2020, 12 pages.
Final Office Action in U.S. Appl. No. 16/736,971, dated Apr. 17, 2020, 6 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Non-Final Office Action in U.S. Appl. No. 16/555,948, dated May 15, 2020, 8 pages.
Extended European Search Report for Application No. 18848041.2, 9 pages.
Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Non-Final Office Action in U.S. Appl. No. 15/889,586 dated Sep. 18, 2020, 19 pages.
Notice of Allowance in U.S. Appl. No. 16/523,840, dated Sep. 30, 2020, 11 pages.
Non Final Office Action in U.S. Appl. No. 16/903,374, dated Nov. 25, 2020, 16 pages.
Final Office Action in U.S. Appl. No. 16/722,115, dated Dec. 2, 2020, 7 pages.
Notice of Allowance in U.S. Appl. No. 16/523,840, dated Dec. 4, 2020, 11 pages.
Notice of Allowance in U.S. Appl. No. 16/555,948, dated Jan. 13, 2021, 7 pages.
Notice of Allowance in U.S. Appl. No. 16/457,791 dated Jan. 22, 2021, 7 pages.
International Search Report and written opinion received for PCT Patent Application No. PCT/US2020/60799, dated Feb. 5, 2021, 11 pages.
Extended European Search Report for Application No. 20195265.2, 8 pages.
Notice of Allowance in U.S. Appl. No. 16/722,115, dated Apr. 1, 2021, 9 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Extended European Search Report for Application No. 20200919.7, 11 pages.
Non-Final Office Action in U.S. Appl. No. 16/722,115, dated May 3, 2021, 9 pages.
Non-Final Office Action in U.S. Appl. No. 15/889,586 dated Jun. 11, 2021, 11 pages.
Notice of Allowance in U.S. Appl. No. 16/737,615 dated Nov. 24, 2021, 11 pages.
International Preliminary Report on Patentability in connection with International Patent Application No. PCT/US2018/025440, dated Oct. 1, 2019, 10 pages.
International Preliminary Report on Patentability in connection with International Patent Application No. PCT/US2020/012641, dated Jun. 16, 2021, 11 pages.
Non-Final Office Action in U.S. Appl. No. 17/213,230 dated Dec. 14, 2021, 6 pages.
Non-Final Office Action in U.S. Appl. No. 17/163,331 dated Mar. 4, 2022, 23 pages.
Notice of Allowance in U.S. Appl. No. 17/098,207 dated Jan. 5, 2023, 15 pages.
English translation of Office Action for Taiwan application No. 109100609 dated Dec. 16, 2021, 5 pages.

\* cited by examiner

EFFICIENT NANOSECOND PULSER WITH SOURCE AND SINK CAPABILITY FOR PLASMA CONTROL APPLICATIONS

CROSS-REFERENCE TO RELATED APPLICATIONS

This application claims priority to U.S. Provisional Patent Application No. 62/789,526 filed Jan. 8, 2019, titled "EFFICIENT ENERGY RECOVERY IN A NANOSECOND PULSER CIRCUIT," which is incorporated by reference in its entirety.

This application claims priority to U.S. Provisional Patent Application No. 62/789,523 filed Jan. 8, 2019, titled "EFFICIENT NANOSECOND PULSER WITH SOURCE AND SINK CAPABILITY FOR PLASMA CONTROL APPLICATIONS," which is incorporated by reference in its entirety.

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{-11}$ V/s). Such steep rise times and/or fall times are very difficult to produce especially in circuits driving a load with low capacitance. Such pulse may be especially difficult to produce using standard electrical components in a compact manner; and/or with pulses having variable pulse widths, voltages, and repetition rates; and/or within applications having capacitive loads such as, for example, a plasma.

SUMMARY

Some embodiments include a high voltage, high frequency switching circuit. In some embodiments, the high voltage, high frequency switching circuit includes a high voltage switching power supply that produces pulses having a voltage greater than 1 kV and with frequencies greater than 10 kHz (or any frequency); a transformer having a primary side and secondary side; an output electrically coupled with the secondary side of the transformer; and a primary sink electrically coupled with the primary side of the transformer and in parallel with the high voltage switching power supply, the primary sink comprising at least one resistor that discharges a load coupled with the output.

In some embodiments, the primary sink is configured to dissipate over about 1 kilowatt of average power. In some embodiments, the primary sink is configured to dissipate 30 W-30 kW of average power.

In some embodiments, the primary sink comprises at least on inductor in series with the at least one resistor.

In some embodiments, the primary sink comprises a switch in series with the at least one resistor.

In some embodiments, the output is coupled with a plasma load that is largely capacitive.

In some embodiments, the output is coupled with a plasma load that includes a dielectric barrier discharge.

In some embodiments, the resistance of the resistor in the primary sink has a value less than about 400 ohms.

In some embodiments, the high voltage high frequency switching power supply delivers peak powers greater than 100 kW.

In some embodiments, the resistor in the primary sink includes a resistance R and the output is coupled with a load having a capacitance C such that $$R \approx \frac{t_f}{a^2 C}$$

where $t_f$ is the pulse fall time and $$a = \frac{N_p}{N_s}.$$

In some embodiments, the load is capacitive in nature with a capacitance less than 50 nF, wherein the load capacitance does not hold charges for times greater than 1 μs.

In some embodiments, the load is capacitive in nature and the high voltage, high frequency switching circuit rapidly charges the load capacitance and discharges the load capacitance.

In some embodiments, the output produces a negative bias voltage on an electrode, substrate, or wafer with respect to the plasma and ground that is greater than −2 kV when the high voltage switching power supply is not providing a high voltage pulse. In some embodiments, the bias voltage may be positive.

In some embodiments, the output can produce a high voltage pulse having a voltage greater than 1 kV and with frequencies greater than 10 kHz with pulse fall times less than about 400 ns, 40 ns, 4 ns, etc.

Some embodiments include a high voltage, high frequency switching circuit. In some embodiments, the high voltage, high frequency switching circuit includes a high voltage switching power supply that produces pulses having a voltage greater than 1 kV and with frequencies greater than 10 kHz; a transformer having a primary side and secondary side; an output electrically coupled with the secondary side of the transformer; and a primary sink electrically coupled to the primary side of the transformer and in parallel with the output of the high voltage switching power supply, the primary sink comprising at least one resistor that discharges a load coupled with the output coupled with the secondary of the transformer and at least one inductor in series with the at least one resistor.

In some embodiments, the primary sink comprises a switch in series with the at least one resistor and/or the at least one inductor.

In some embodiments, the output can produce a high voltage pulse having a voltage greater than 1 kV and with frequencies greater than 10 kHz and with a pulse fall time less than about 400 ns.

In some embodiments, the primary sink is configured to dissipate over about 1 kilowatt of power.

In some embodiments, the high voltage switching power supply comprises a power supply, at least one switch, and a step-up transformer.

In some embodiments, the primary sink handles a peak power greater than 10 kW.

In some embodiments, the resistance of the resistor in the primary sink is less than about 400 ohms.

In some embodiments, the primary sink includes an inductor and a resistor, and wherein the inductance L of the inductor and the resistance R of the resistor are set to satisfy L/R≈tp, where tp is the pulse width of the pulse.

In some embodiments, the resistor in the primary sink includes a resistance R and the output is coupled with a load having a capacitance C such that $$R \approx \frac{t_f}{a^2 C}$$

where $t_f$ is the pulse fall time and $$a = \frac{N_p}{N_s}.$$

In some embodiments, the high voltage switching power supply establishes a potential within a plasma that is used to accelerate ions into a surface.

In some embodiments, the output produces a negative potential difference from the electrode or substrate (or wafer and plasma) with respect to ground that is greater than −2 kV when the high voltage switching power supply is not providing a high voltage pulse.

Some embodiments include a high voltage, high frequency switching circuit. In some embodiments, the high voltage, high frequency switching circuit includes a high voltage switching power supply that produces pulses having a voltage greater than 1 kV and with frequencies greater than 10 kHz; a transformer having a primary side and secondary side; an output electrically coupled with the secondary side of the transformer; and a primary sink electrically coupled with the primary side of the transformer and in parallel with the output of the high voltage switching power supply, the primary sink comprising at least one resistor, at least one inductor, and a switch arranged in series. In some embodiments, the output can produce a high voltage pulse having a voltage greater than 1 kV with frequencies greater than 10 kHz and with pulse fall times less than about 400 ns, and wherein the output is electrically coupled to a plasma type load.

In some embodiments, the plasma type load can be modeled as having capacitive elements less than 20 nF, 10 nF, 100 pF, 10 pF, 1 pF, 0.5 pF, etc.

In some embodiments, the plasma type load is designed to accelerate ions into a surface.

In some embodiments, a potential is established to accelerate ions into a surface through the action of the high voltage high frequency switching power supply.

In some embodiments, the plasma type is largely capacitive in nature.

In some embodiments, the plasma type load includes a dielectric barrier discharge.

In some embodiments, the high voltage high frequency switching power supply delivers peak powers greater than 100 kW.

In some embodiments, the high voltage switching power supply comprises a power supply, at least one switch, and a step-up transformer.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Systems and methods are disclosed for a nanosecond pulser system (e.g., a high voltage, high frequency switching circuit) having a primary sink. In some embodiments, a nanosecond pulser system may be used to drive a plasma deposition system, plasma etch system, plasma sputtering system, e-beam system, ion beam system, etc.

Figure 1:
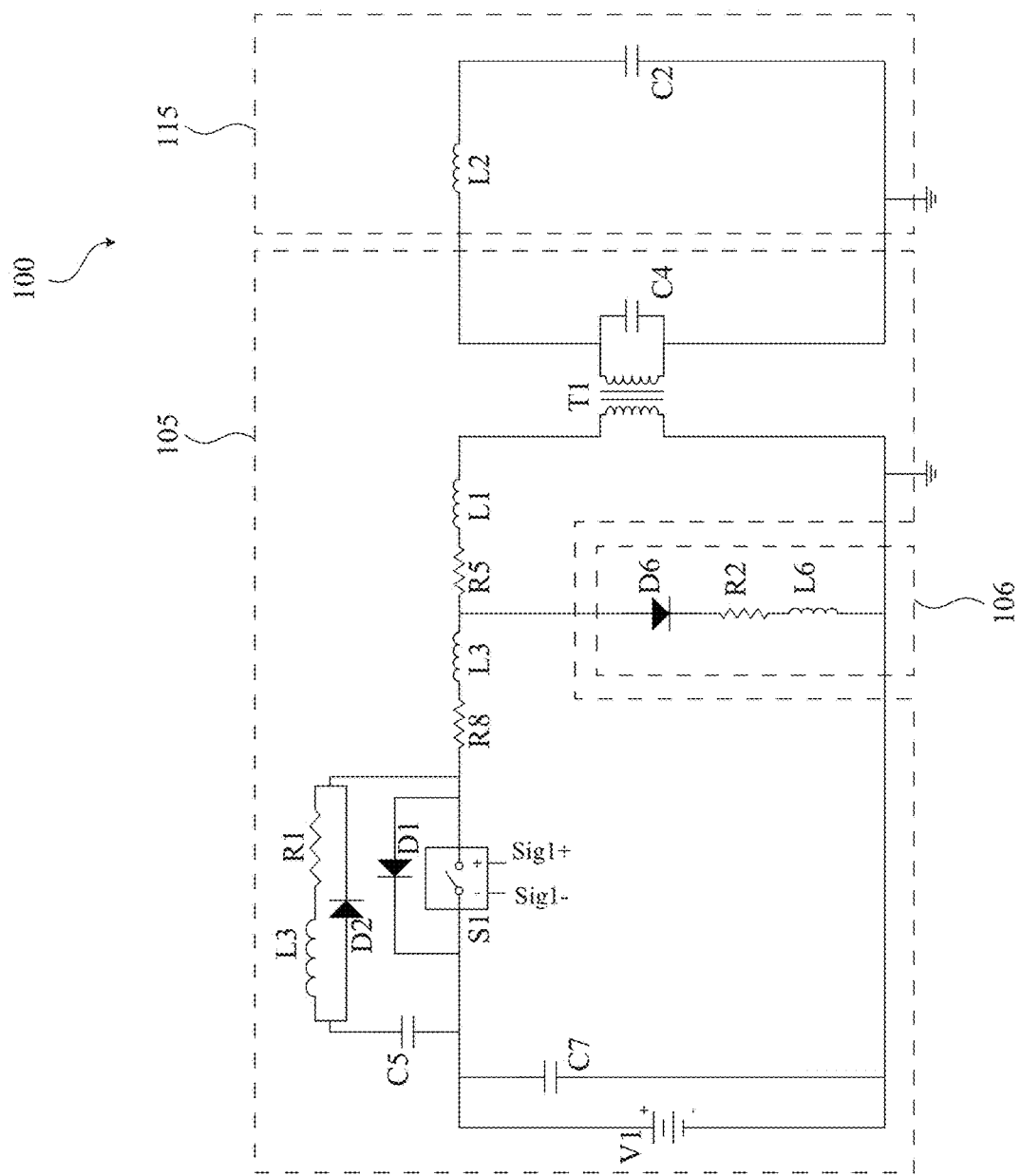
FIG. 1 is a circuit diagram of a nanosecond pulser system with a primary sink according to some embodiments.

FIG. 1 is a circuit diagram of a nanosecond pulser system 100 according to some embodiments. The nanosecond pulser system 100 includes a nanosecond pulser 105, a primary sink 106, a transformer T1, and a load stage 115.

In some embodiments, the nanosecond pulser 105 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the nanosecond pulser 105 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the nanosecond pulser 105 includes a switch S1 coupled with a power supply C7 (e.g., energy storage capacitor that may be coupled with a power supply), that may provide a consistent DC voltage that is switched by the switch S1 and provides the switched power to the transformer T1. The switch S1, for example, may include one or more solid state switches such as, for example, an IGBT, a MOSFET, a SiC MOSFET, SiC junction transistor, FETs, SiC switches, GaN switches, photoconductive switch, etc. In some embodiments, a gate resistor coupled with the switch S1 may be set with short turn on pulses.

In some embodiments, the resistor R8 and/or the resistor R5 may represent the stray resistance within the nanosecond pulser 105. In some embodiments, the inductor L3 and/or the inductor L1 may represent the stray inductance within the nanosecond pulser 105.

In some embodiments, the nanosecond pulser 105 may include snubber circuit that may include snubber resistor R1 and snubber inductor L3 both of which may be arranged in parallel with snubber diode D2. The snubber circuit may also include a snubber capacitor C5. In some embodiments, the snubber resistor R1 and snubber inductor L3 and/or the snubber diode D2 may be placed between the collector of switch S1 and the primary winding of the transformer T1. The snubber diode D2 may be used to snub out any over voltages in the switching. A large and/or fast capacitor C5 may be coupled on the emitter side of the switch S1. The freewheeling diode D1 may also be coupled with the emitter side of the switch S1. Various other components may be included that are not shown in the figures.

In some embodiments, the freewheeling diode D1 may be used in combination with inductive loads to ensure that energy which is stored in the inductor is allowed to dissipate after the switch S1 is opened by allowing current to keep flowing in the same direction through the inductor and energy is dissipated in the resistive elements of the circuit. If they are not used then this can, for example, lead to a large reverse voltage on the switch S1.

In some embodiments, the primary sink 106 may be disposed in parallel with the switch S1 (and snubber circuit). The primary sink 106, for example, may include a sink diode D6, a resistor R2, and sink inductor L6 arranged in series. In some embodiments, the resistor R2 may include one or more resistors with a resistance of about 100 ohms. In some embodiments, the sink inductor L6 may include one or more inductors with an inductance of about 100 µH. In some embodiments, the resistor R2 may comprise a plurality of resistors arranged in parallel and/or series. In some embodiments, the sink inductor L6 may comprise a plurality of inductors arranged in parallel and/or series.

In some embodiments, the sink diode D6 may be arranged to allow current to flow from the transformer T1 to ground.

In some embodiments, the sink diode D6, the resistor R2 and the sink inductor L6 are arranged in parallel with the transformer T1.

In some embodiments, the resistor R2 and the sink inductor L6 are disposed on the primary side of the transformer T1.

The use of a primary sink to achieve high voltage pulses at high frequencies that have fast rise/fall times, and/or short pulse widths may constrain the selection of the circuit elements in the resistive output stage (e.g., R2 and L6). The primary sink may be selected to handle high average power, high peak power, fast rise times and/or fast fall times. For example, the average power rating might be greater than about 10 W, 50 W, 100 W, 0.5 kW, 1.0 kW, 10 kW, 25 kW, etc., the peak power rating might be greater than about 1 kW, 10 kW, 100 kW, 1 MW, etc., and/or the rise and fall times might be less than 1000 ns, 100 ns, 10 ns, or 1 ns.

The high average power and/or peak power requirement may arise both from the need to dissipate stored energy in the load stage 115 rapidly, and/or the need to do so at high frequency. For example, if the load stage 115 is capacitive in nature (as shown in FIG. 1, with capacitance C12), with a 1 nF capacitance that needs discharging in 20 ns, and if the primary sink may be purely resistive (e.g., minimal value of L6), the primary sink may have a resistance value of about 12.5 mOhms. If the high voltage pulse applied to the load is 100 ns long at 20 kV, then each pulse will dissipate about 2 J during the 100 ns pulse width (e.g., $E=t_p V_p^2/R$) and an additional 0.2 J draining the stored energy from the 1 nF capacitive load (e.g., $E=\frac{1}{2}t_p C V_s^2$), where $t_p$ is the pulse width, V is the pulse voltage, R2 is the resistance of the primary sink, C is the capacitance of the load, $V_p$ is the voltage on the primary side of the transformer, $V_s$ is the voltage on the secondary side of the transformer, and E is the energy. If operated at 10 kHz, the total per pulse energy dissipation of 2.2 J may result in an average power dissipation of 22 kW into the primary sink. The peak power dissipation in the primary sink during the pulse may be about 20 MW, and may be calculated from Power=$V^2/R$.

The high frequency and high voltage operation, combined with the need for the resistance in the primary sink to be small, for example, may lead to examples with either or both high peak power and high average power dissipation within the primary sink. Standard pulldown resistors that are used in TTL type electrical circuits and/or data acquisition type circuits (e.g., around 5 volts) usually operate far below 1 W for both average and peak power dissipation.

In some embodiments, the ratio of the power the primary sink 106 dissipates compared to the total power dissipated by the load stage 115 may be 10%, 20% 30% or greater, for example. In standard low voltage electronic circuits, pull down resistors dissipate less than 1% of the power consumed, and typically much less.

The fast rise time and/or fast fall time requirements may constrain both the allowable stray inductance and/or stray capacitance within the primary sink. In the above example, for the 1 nF capacitive load to be discharged in around 20 ns, the series stray inductance in the primary sink may be less than about 1,000 nH, 500 nH, 300 nH, 100 nH, 30 nH, etc. In some embodiments, L6/R2<$t_f$. In some embodiments, the L/R time for the For the primary sink to not waste significant additional energy due to its stray capacitance, for example, less than 10% of the capacitive energy stored in the load capacitance, then the stray capacitance of the primary sink may be less than 100 pF. Since the primary sink may tend to be physically large due to its high power dissipation requirements, realizing both this low stray inductance and stray capacitance can be challenging. The design generally requires significant parallel and series operation using numerous discrete components (e.g., resistors), with the components tightly grouped together, and/or spaced far from any grounded surfaces that could significantly increase the stray capacitance.

In some embodiments, the load stage 115 may include a dielectric barrier discharge device. The load stage 115 in a dielectric barrier discharge can be dominantly capacitive. In some embodiments, the load may be modeled as a purely capacitive load CL, for example, like a dielectric barrier discharge. For example, when the power supply P is switched on, capacitive load CL may be charged, when power supply P is not switched on, the charge on capacitive load CL may be drained through resistor R. In addition, due to high voltages and/or high frequencies and/or fast fall time requirements a primary sink may need to discharge a significant amount of charge from the capacitive load CL quickly, which may not be the case with low voltage applications (e.g., standard 5 V logic levels and or low voltage data pulsers).

For example, a typical dielectric barrier discharge device might have a capacitance of about 10 pF and/or may be driven to about 20 kV with about a 20 ns rise time and/or about a 20 ns fall time. In some embodiments, the desired pulse width might be 80 ns long. For the fall time to match the rise time, resistor R2 may be about 12.5 Ohms can be used to create the desired fall time. Various other values for the circuit element resistor R2 may be used depending on the load and/or the other circuit elements and/or the requirements rise time, fall time, and/or pulse width, etc.

In some embodiments, for a capacitive like load, or a load that has an effective capacitance C (e.g., the capacitance C12), the characteristic pulse fall time can be designated as $t_f$ and the pulse rise time can be designated by $t_r$. In some embodiments, the rise time $t_r$ can be set by the specifics of the driving power supply. In some embodiments, the pulse fall time $t_f$ can be approximately matched to the pulse rise time $t_r$ by selecting resistor R2, where $$R2 \approx \frac{t_f}{a^2 C}.$$

In some embodiments, R2 can be specifically selected to provide a specific relation between the pulse rise time $t_r$ and the pulse fall time $t_f$. This is different from the concept of a pull down resistor, where in general, a pull down resistor is selected to carry/dissipate voltage/charge on some longer time scale, and at much lower power levels. Resistor R2, in some embodiments, can be specifically used as an alternative to a pull down switch, to establish a specific relation between the pulse rise time $t_r$ and the pulse fall time $t_f$.

In some embodiments, the power dissipated in resistor R2 during a pulse having a pulse width $t_p$ and a drive voltage V can be found from $P=V^2/R$. Because fall time $t_f$ is directly proportional to resistance R $$\left(e.g., R2 \approx \frac{t_f}{a^2 C}\right),$$

as the requirement for fall time $t_f$ decreases then the requirement for the resistance R also decreases, and the power P dissipated in resistor R2 increases according to $P=V^2 C/t_f$. Thus, resistor R2 may be designed to ensure the proper fall time $t_f$ yet be capable of handling high power such as, for example, power greater than about 1.0 kW, or 100 kW. In some embodiments the resistor may handle the average power requirements as well as peak power requirements. The need for fast fall time $t_f$ resulting in low resistance values and the resulting high power dissipation are challenges that can make primary sinks undesirable as a way to quickly remove charge from a capacitive load C2. In some embodiments, a resistor R can include a resistor with low resistance and yet have a high average power rating and peak power rating.

In some embodiments, the resistor R2 may include a series and/or parallel stack of resistors that collectively have the required resistance and power rating. In some embodiments, the resistor R2 may include a resistor have a resistance less than about 2,000 ohms, 500 ohms, 250 ohms, 100 ohms, 50 ohms, 25 ohms, 10 ohms, 1 ohm, 0.5 ohms, 0.25 ohms, etc., and have an average power rating greater than about 0.5 kW, 1.0 kW, 10 kW, 25 kW, etc., and have a peak power rating greater than about 1 kW, 10 kW, 100 kW, 1 MW, etc.

Using the example above, with tp=80 ns, V=500 kV, and resistor R2 12.5 kOhms, each pulse applied to the load may dissipate 16 mJ once the capacitance in the load is fully charged. Once the pulse is turned off, charge from the load is dissipated by resistor R2. If operated at 100 kHz, then resistor R2 may dissipate 1.6 kW. If resistor R2 had been selected to create a 10 ns $t_f$, then the power dissipated in resistor R2 would be 3.2 kW. In some embodiments, a high voltage pulse width may extend to 500 ns. At 500 ns with $t_f$=20 ns, resistor R2 would dissipate 10 kW.

In some embodiments, the power dissipated in the resistor R2 can be considered large if it exceeds 10% or 20% of the power consumed by the load stage 115.

When fast fall times $t_f$ are needed, then the power dissipation can be large such as, for example, about one third the total power consumed. If resistor R2, for example, includes a resistor R2 in series with an sink inductor L6, then sink inductor L6 can, for example, reduce the power flow into the resistor R while the voltage V is present and/or hasten the fall time beyond that set by an RC decay.

For example, the time constant L6/R2 can be set to approximately the pulse width $t_p$, for example, L6/R2≈$t_p$. This, for example, may reduce energy dissipation and/or shorten the fall time $t_f$ (e.g., decreases $t_f$). In some embodiments, R2≈C/$t_f$≈C/$t_r$, assuming one wanted to match $t_f$ to $t_r$. In this application, disclosure, and/or claims, the symbol "≈" means within a factor of ten.

In some embodiments, the transformer T1 may be part of the nanosecond pulser 105.

Figure 2:
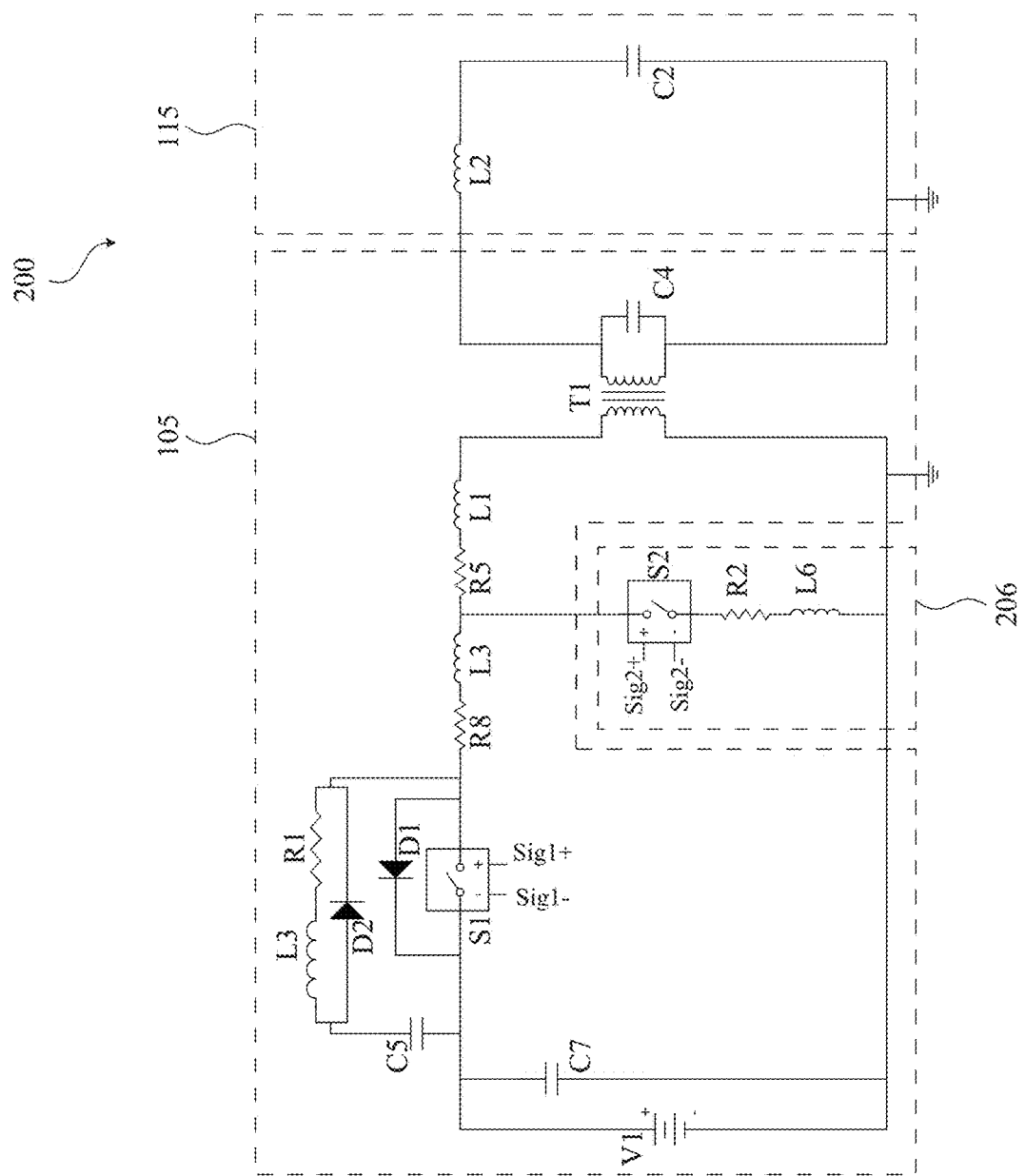
FIG. 2 is a circuit diagram of a nanosecond pulser system with a primary sink according to some embodiments.

FIG. 2 is a circuit diagram of a nanosecond pulser system 200 according to some embodiments. The nanosecond pulser system 200 includes the nanosecond pulser 105, a primary sink 206, the transformer T1, and the load stage 115.

In some embodiments, the primary sink 206 may include a sink switch S2 in place of or in addition to the sink diode D6. In some embodiments, the sink switch S2 may be arranged in series with the sink inductor L6 and/or the sink resistor R2.

In some embodiments, the sink switch S2, for example, can be closed when the load capacitance C2 is to be dumped through the sink resistor R2 and/or the sink inductor L6. For example, the sink switch S2 may switch on and/or off to dump charge from the load capacitor C2 after each pulse. During each pulse, for example, sink switch S2 may be open. At the end of each pulse, the sink switch S2 may be closed to dump the load capacitance into the resistor R2. For example, the sink switch S2 may closed when the switch S1 is open and/or the sink switch S2 may be open when the switch S1 is closed.

Figure 11:
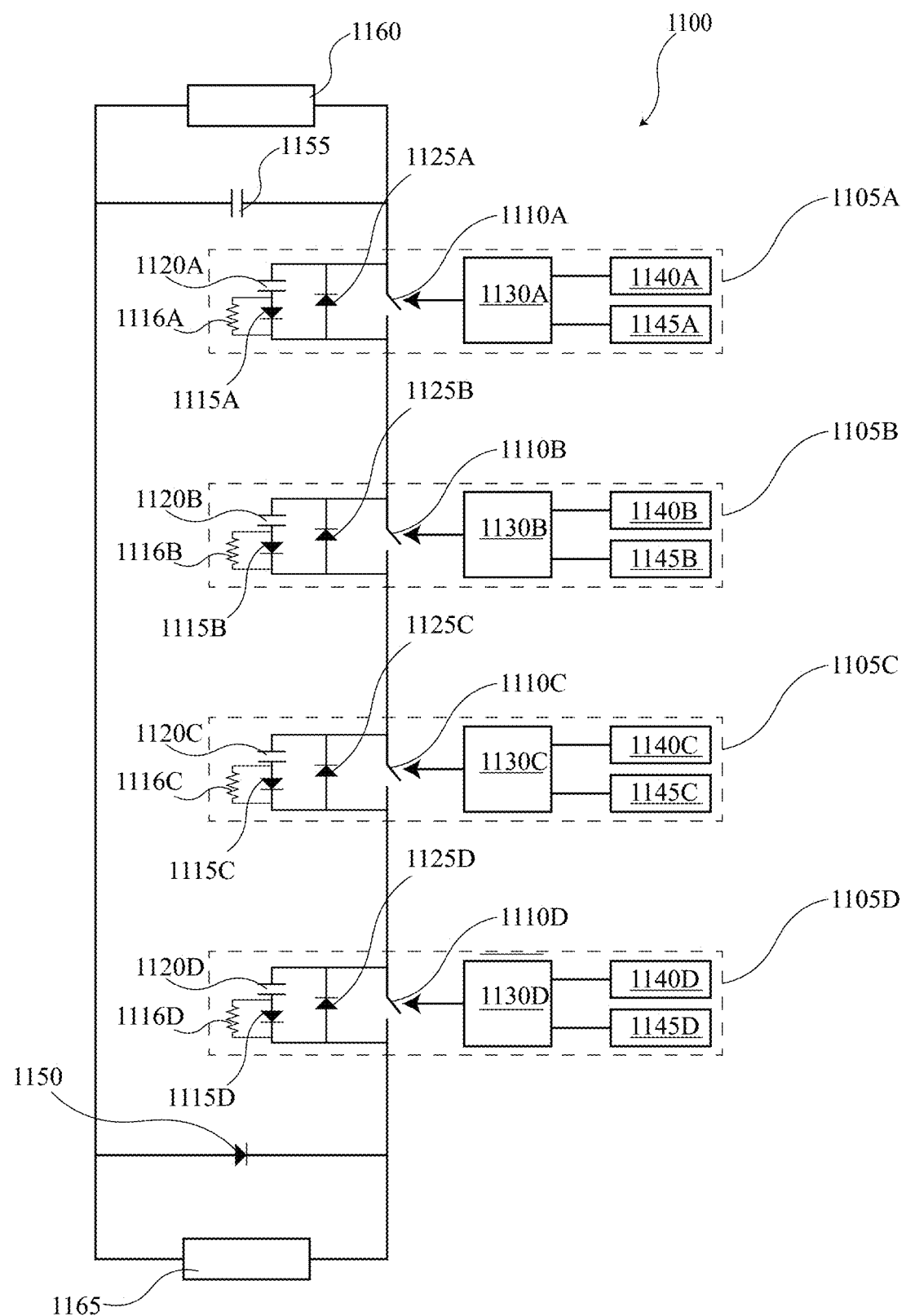
FIG. 11 is a block diagram of a high voltage switch with isolated power according to some embodiments.

In some embodiments, the sink switch S2 may include the high voltage switch 1100 described in FIG. 11.

Figure 3:
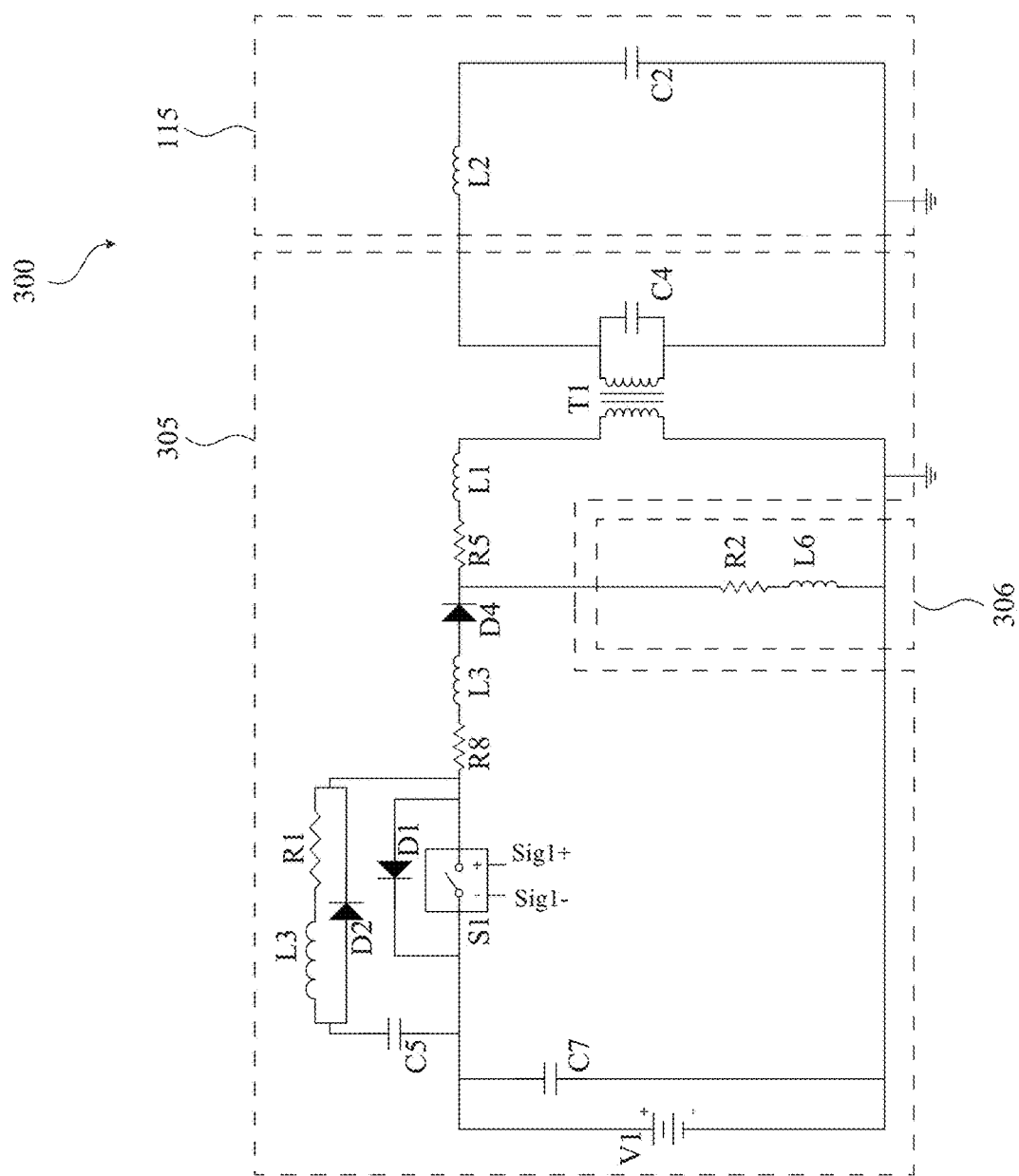
FIG. 3 is a circuit diagram of a nanosecond pulser system with a primary sink according to some embodiments.

FIG. 3 is a circuit diagram of a nanosecond pulser system 300 according to some embodiments. The nanosecond pulser system 300 includes a nanosecond pulser 305, a primary sink 306, the transformer T1, and the load stage 115.

In some embodiments, the nanosecond pulser 305 may include a diode D4 disposed between the sink switch S2 and the primary sink 306. The diode D4 may be arranged to allow current to flow through the switch S1 toward the transformer T1 and restrict current from flowing from the transformer T1 toward the switch S1.

The primary sink 306 may include the components of primary sink 106 except the sink diode D6. In some embodiments, primary sink 306 may include the sink diode D6 and/or the sink switch S2.

Figure 4:
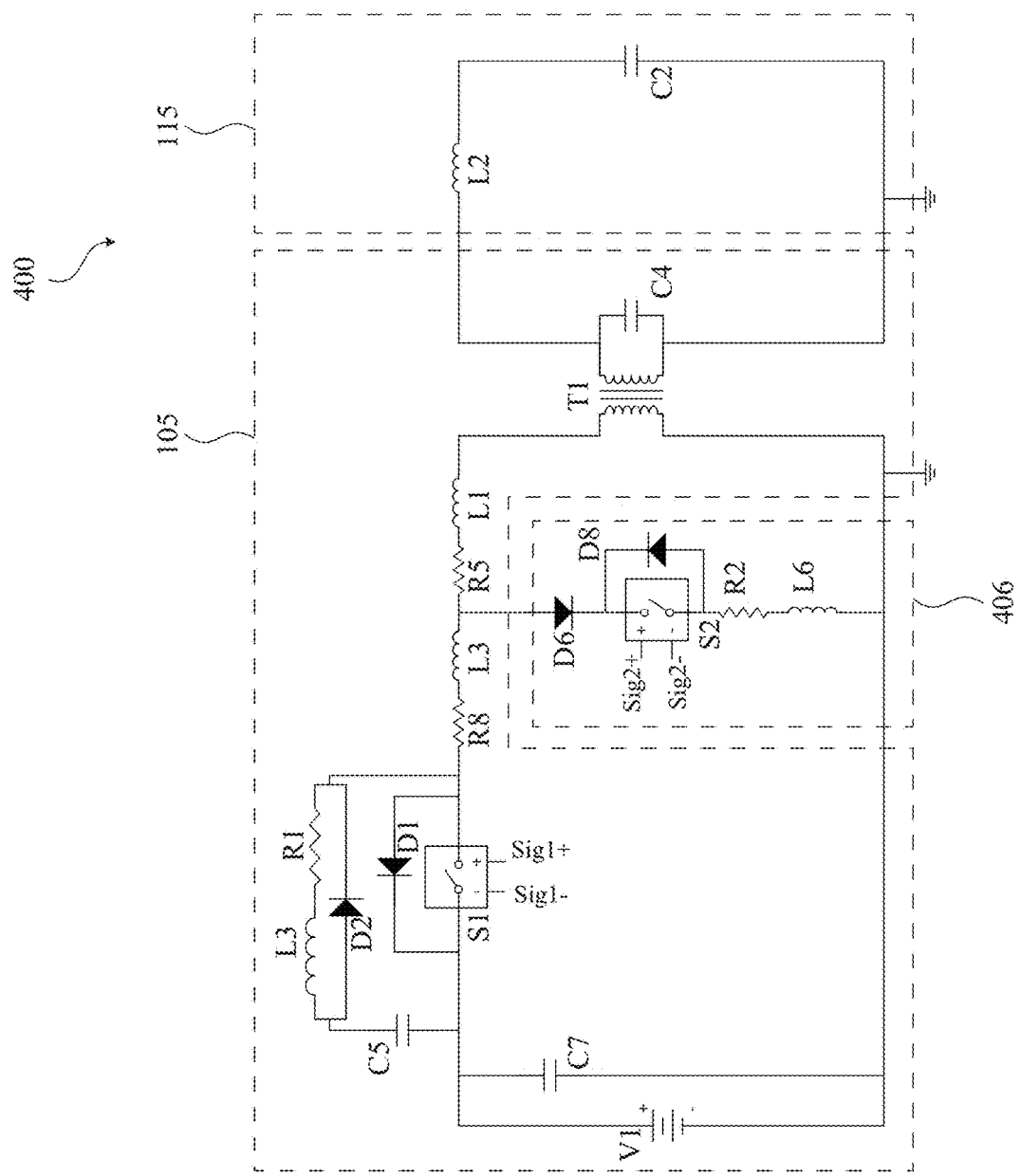
FIG. 4 is a circuit diagram of a nanosecond pulser system with a primary sink according to some embodiments.

FIG. 4 is a circuit diagram of a nanosecond pulser system 400 according to some embodiments. The nanosecond pulser system 400 includes the nanosecond pulser 105, a primary sink 406, the transformer T1, and the load stage 115.

In some embodiments, the primary sink 406 may include the sink switch S2 and the sink diode D6. In some embodiments, the sink switch S2 may be arranged in series with the sink inductor L6 and/or the sink resistor R2. In some embodiments, a crowbar diode D8 may be included across the sink switch S2.

In some embodiments, the sink switch S2, for example, can be closed when the load capacitance C2 is to be dumped through the sink resistor R2 and/or the sink inductor L6. For example, the sink switch S2 may switch on and/or off to dump charge from the load capacitor C2 after each pulse. During each pulse, for example, sink switch S2 may be open. At the end of each pulse, the sink switch S2 may be closed to dump the load capacitance into the resistor R2. For example, the sink switch S2 may closed when the switch S1 is open and/or the sink switch S2 may be open when the switch S1 is closed.

Figure 5:
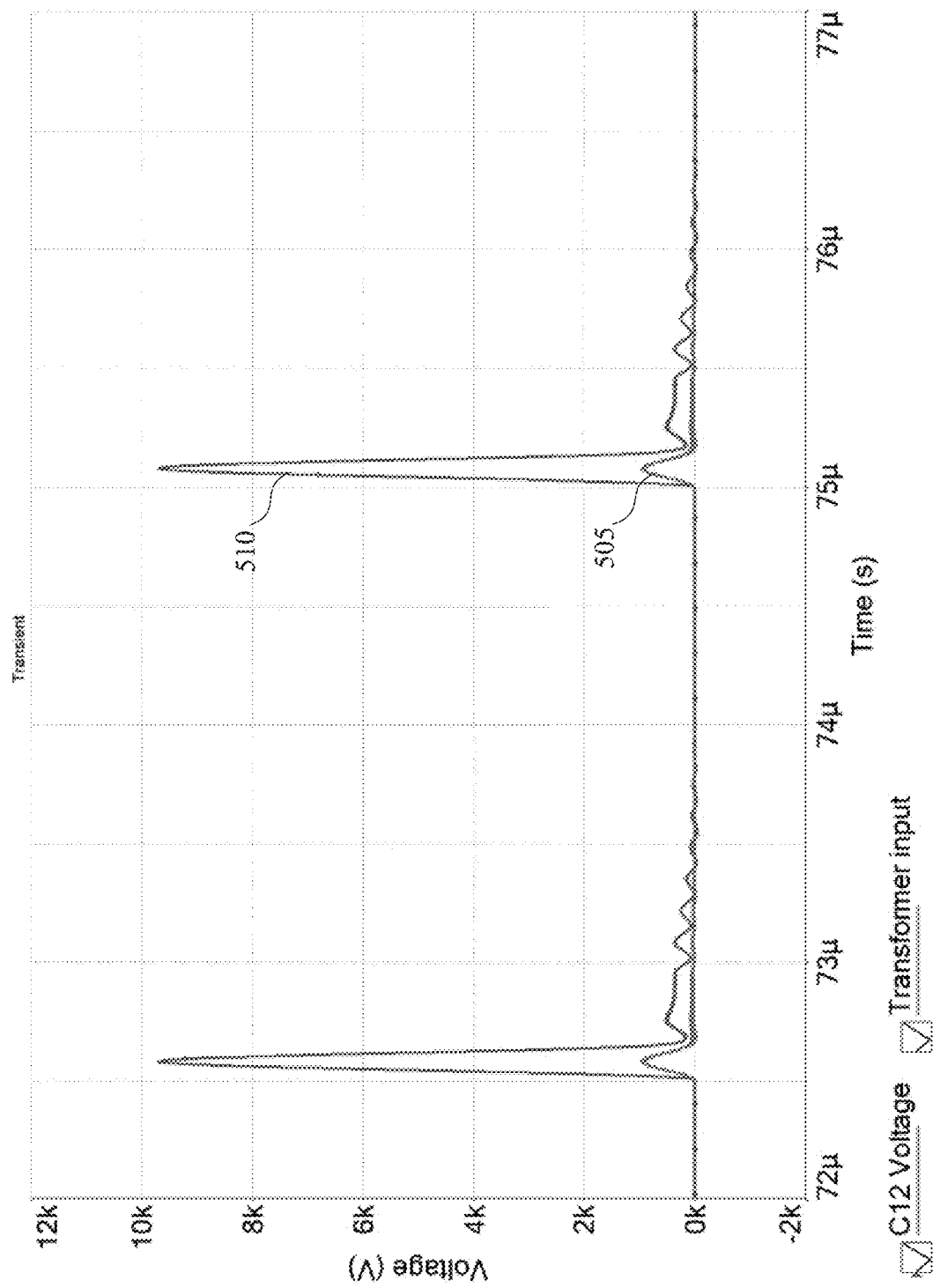
FIG. 5 are waveforms produced by a nanosecond pulser system.

FIG. 5 illustrates waveform 505 showing the voltage at the input to the transformer T1 and waveform C8 showing the voltage at the load stage 115 using the nanosecond pulser system 300 shown in FIG. 3.

Figure 6:
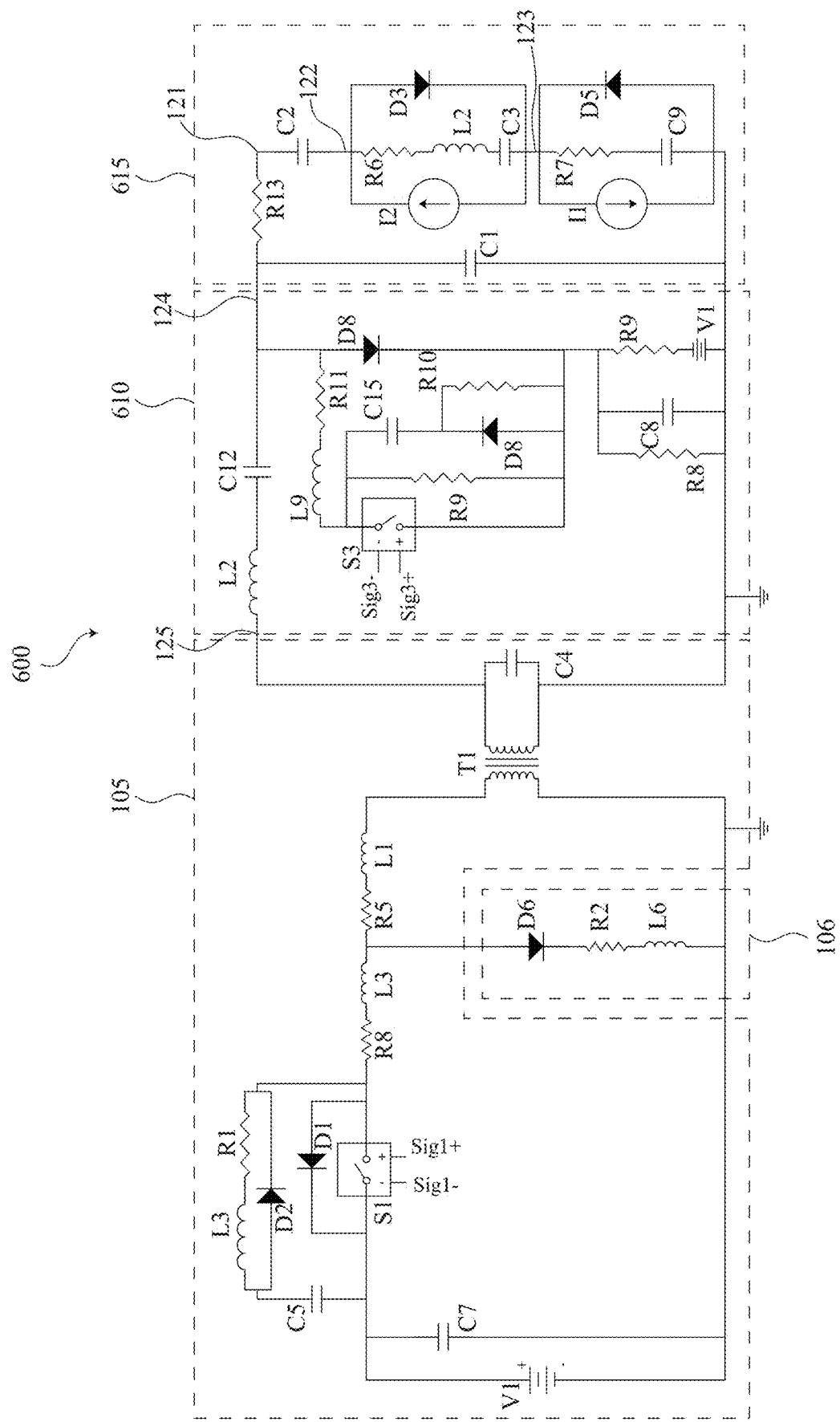
FIG. 6 is a circuit diagram of a nanosecond pulser system with a primary sink, a bias compensation circuit, and a plasma load according to some embodiments.

FIG. 6 illustrates a nanosecond pulser system 600 according to some embodiments. The nanosecond pulser system 600 includes the nanosecond pulser 105, the primary sink 106, the transformer T1, a bias compensation circuit 610, and a load stage 615.

In some embodiments, the bias compensation circuit 610, may include a high voltage switch S3 coupled across the bias compensation diode D8 and arranged in series with offset power supply V1 and bias compensation resistor R9. In some embodiments, the high voltage switch S3 may include a plurality of switches arranged in series to collectively open and close high voltages. For example, the high voltage switch S3 may include the high voltage switch 1100 described in FIG. 11. In some embodiments, the high voltage switch S3 may be opened and closed based on signals Sig3+ and Sig3−.

The high voltage switch S3 may be coupled in series with either or both an inductor L9 and a resistor R11. The inductor L9 may limit peak current through high voltage switch S3. The inductor L9, for example, may have an inductance less than about 100 µH such as, for example, about 250 µH, 100 µH, 50 µH, 25 µH, 10 µH, 5 µH, 1 µH, etc. The resistor R11, for example, may shift power dissipation to the primary sink. The resistance of resistor R11, for example, may have a resistance of less than about 1,000 ohms, 500 ohms, 250 ohms, 100 ohms, 50 ohms, 10 ohms, etc.

In some embodiments, the high voltage switch S3 may include a snubber circuit. The snubber circuit may include resistor R9, snubber diode D8, snubber capacitor C15, and snubber resistor R10.

In some embodiments, the resistor R8 can represent the stray resistance of the offset supply voltage V1. The resistor R8, for example, may have a high resistance such as, for example, a resistance of about 10 kOhm, 100 kOhm, 1 MOhm, 10 MOhm, 100 MOhm, 1 GOhm, etc.

In some embodiments, the bias compensation capacitor C8 may have a capacitance less than 100 nF to 100 µF such as, for example, about 100 µF, 50 µF, 25 µF, 10 µF, 2 µF, 500 nF, 200 nF, etc.

In some embodiments, the bias compensation capacitor C8 and the bias compensation diode D8 may allow for the voltage offset between the output of the nanosecond pulser 105 (e.g., at the position labeled 125) and the voltage on the electrode (e.g., at the position labeled 124) to be established at the beginning of each burst, reaching the needed equilibrium state. For example, charge is transferred from capacitor C12 into capacitor C8 at the beginning of each burst, over the course of a plurality of pulses (e.g., maybe about 5-100), establishing the correct voltages in the circuit.

In some embodiments, the bias capacitor C12 may allow for a voltage offset between the output of the nanosecond pulser 105 (e.g., at the position labeled 125) and the voltage on the electrode (e.g., at the position labeled 124). In operation, the electrode may, for example, be at a DC voltage of −2 kV during a burst, while the output of the nanosecond pulser alternates between +6 kV during pulses and 0 kV between pulses.

The bias capacitor C12, for example, may have a capacitance of about 100 nF, 10 nF, 1 nF, 100 µF, 10 µF, 1 µF, etc. The resistor R9, for example, may have a high resistance such as, for example, a resistance of about 1 kOhm, 10 kOhm, 100 kOhm, 1 MOhm, 10 MOhm, 100 MOhm, etc.

The bias compensation circuit 610 may include any number of other elements or be arranged in any number of ways.

In some embodiments, the high voltage switch S3 may be open while the nanosecond pulser 105 is pulsing and closed when the nanosecond pulser 105 is not pulsing. When the high voltage switch S3 is closed, for example, current can short across the bias compensation diode D8. Shorting this current may allow the bias between the wafer and the chuck to be less than 2 kV (or another voltage value), which may be within acceptable tolerances. In some embodiments, the bias compensation diode D8 may conduct currents of between 10 A and 1 kA at a frequency of between 10 Hz and 10 kHz.

In some embodiments, the high voltage switch S3 may include the high voltage switch 1100 described in FIG. 11.

In some embodiments, the load stage 615 may represent an idealized or effective circuit for semiconductor processing chamber such as, for example, a plasma deposition system, semiconductor fabrication system, plasma sputtering system, etc. The capacitance C2, for example, may represent the capacitance of the chuck upon which the wafer may sit. The chuck, for example, may comprise a dielectric material. For example, the capacitor C1 may have small capacitance (e.g., about 10 pF, 100 pF, 500 pF, 1 nF, 10 nF, 100 nF, etc.).

The capacitor C3, for example, may represent the sheath capacitance between the plasma and the wafer. The resistor R6, for example, may represent the sheath resistance between the plasma and the wafer. The inductor L2, for example, may represent the sheath inductance between the plasma and the wafer. The current source 12, for example, may be represent the ion current through the sheath. For example, the capacitor C1 or the capacitor C3 may have small capacitance (e.g., about 10 pF, 100 pF, 500 pF, 1 nF, 10 nF, 100 nF, etc.).

The capacitor C9, for example, may represent capacitance within the plasma between a chamber wall and the top surface of the wafer. The resistor R7, for example, may represent resistance within the plasma between a chamber wall and the top surface of the wafer. The current source I1, for example, may be representative of the ion current in the plasma. For example, the capacitor C1 or the capacitor C9 may have small capacitance (e.g., about 10 pF, 100 pF, 500 pF, 1 nF, 10 nF, 100 nF, etc.).

As used in this document the plasma voltage is the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage is the voltage measure from ground to circuit point 124; and the input voltage is the voltage measured from ground to circuit point 125.

Figure 7:
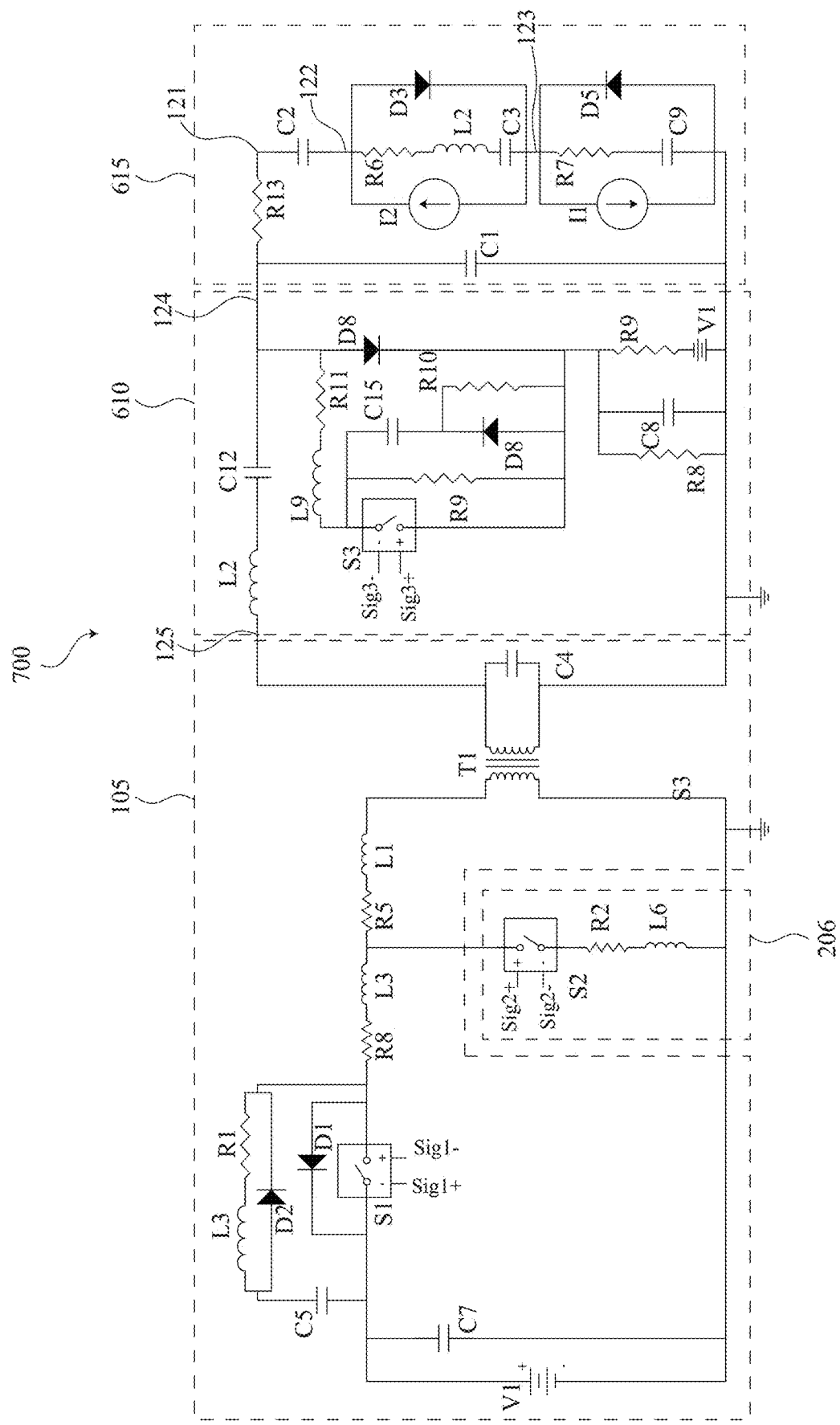
FIG. 7 is a circuit diagram of a nanosecond pulser system with a primary sink, a bias compensation circuit, and a plasma load according to some embodiments.

FIG. 7 illustrates a nanosecond pulser system 700 according to some embodiments. The nanosecond pulser system 700 includes the nanosecond pulser 105, the primary sink 206, the transformer T1, the bias compensation circuit 610, and the load stage 615.

Figure 8:
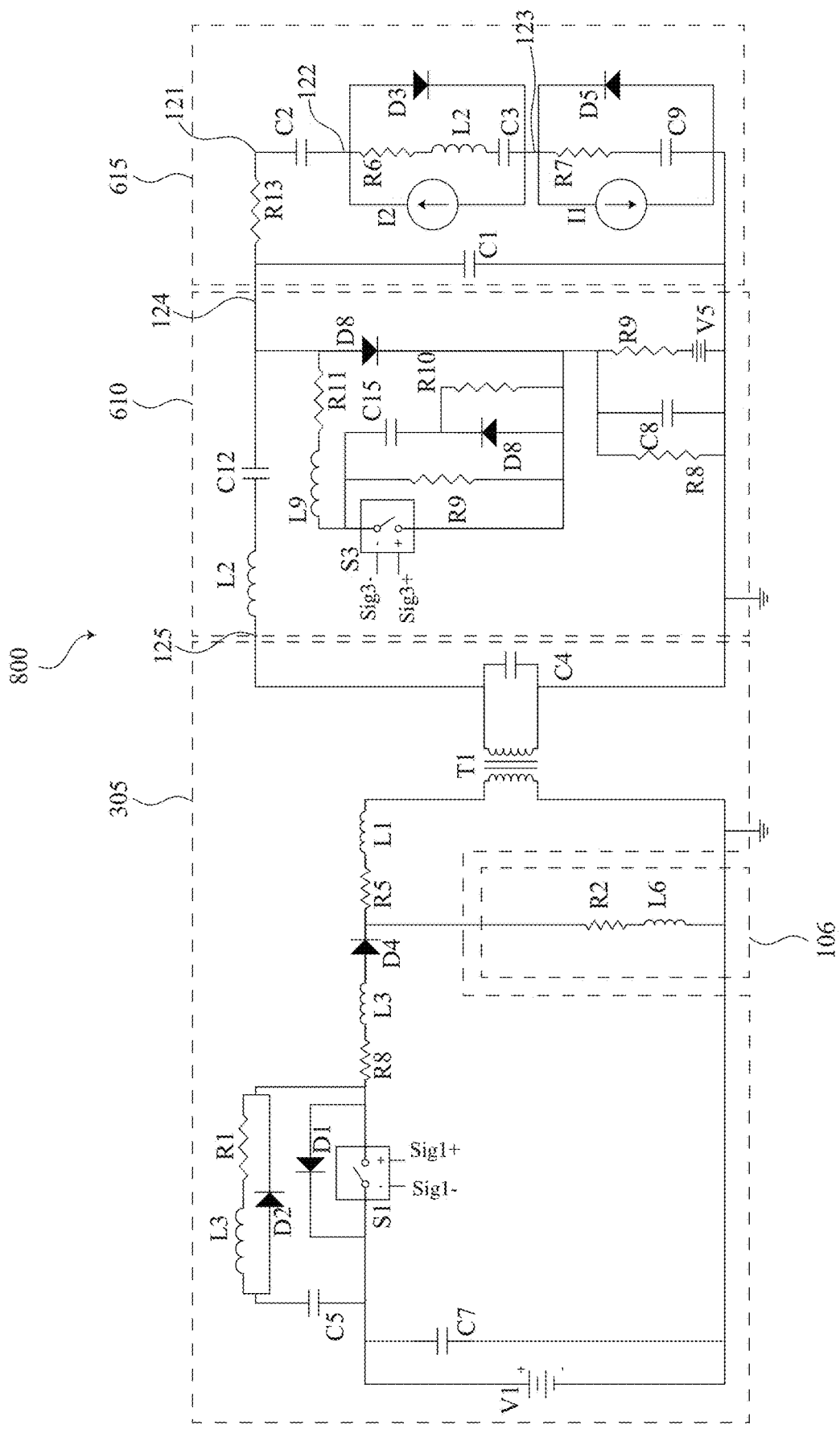
FIG. 8 is a circuit diagram of a nanosecond pulser system with a primary sink, a bias compensation circuit, and a plasma load according to some embodiments.

FIG. 8 illustrates a nanosecond pulser system 800 according to some embodiments. The nanosecond pulser system 800 includes the nanosecond pulser 305, the primary sink 106, the transformer T1, the bias compensation circuit 610, and the load stage 615.

Figure 9:
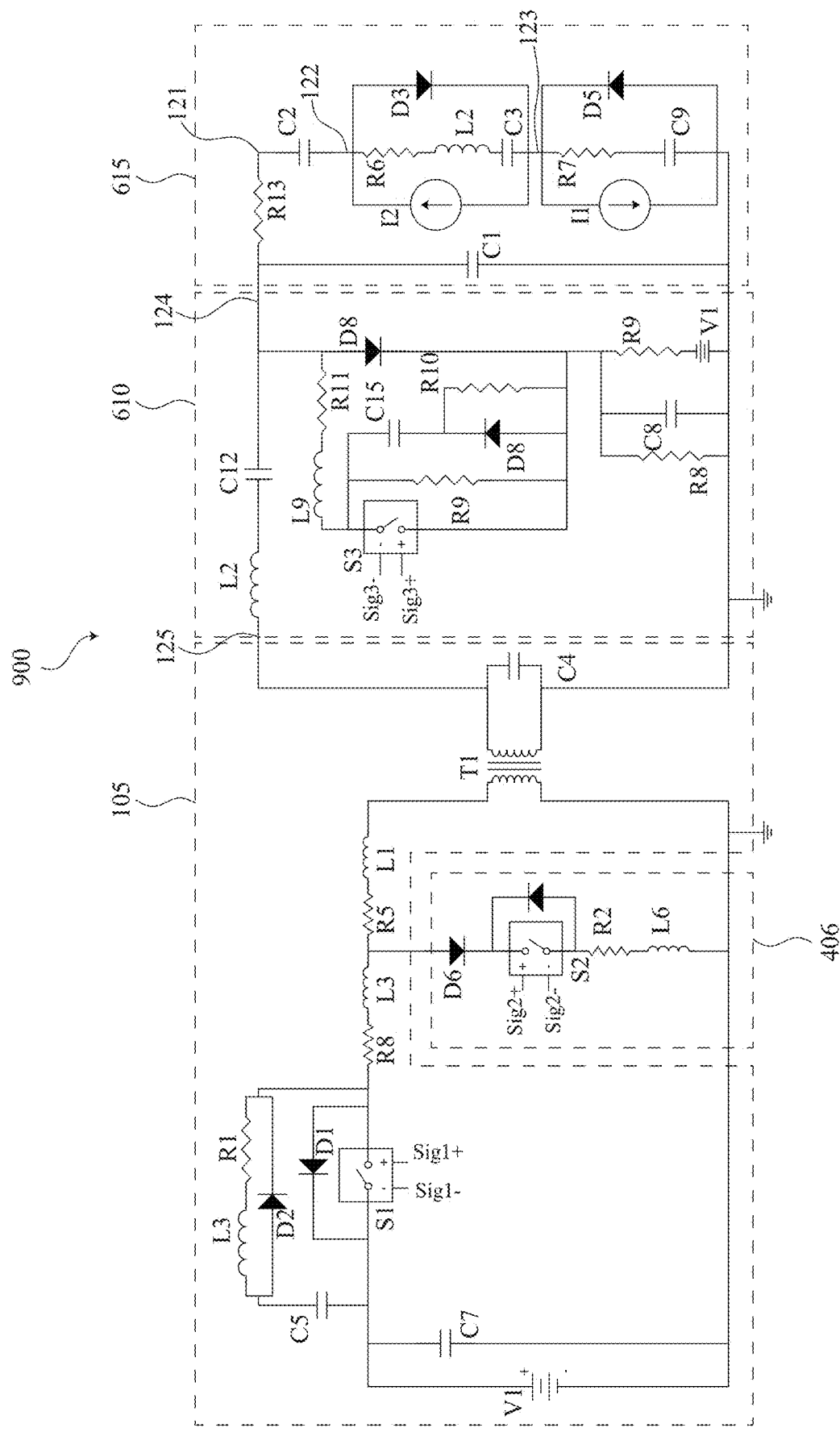
FIG. 9 is a circuit diagram of a nanosecond pulser system with a primary sink, a bias compensation circuit, and a plasma load according to some embodiments.

FIG. 9 illustrates a nanosecond pulser system 900 according to some embodiments. The nanosecond pulser system 900 includes the nanosecond pulser 105, the primary sink 406, the transformer T1, the bias compensation circuit 610, and the load stage 615.

Figure 10:
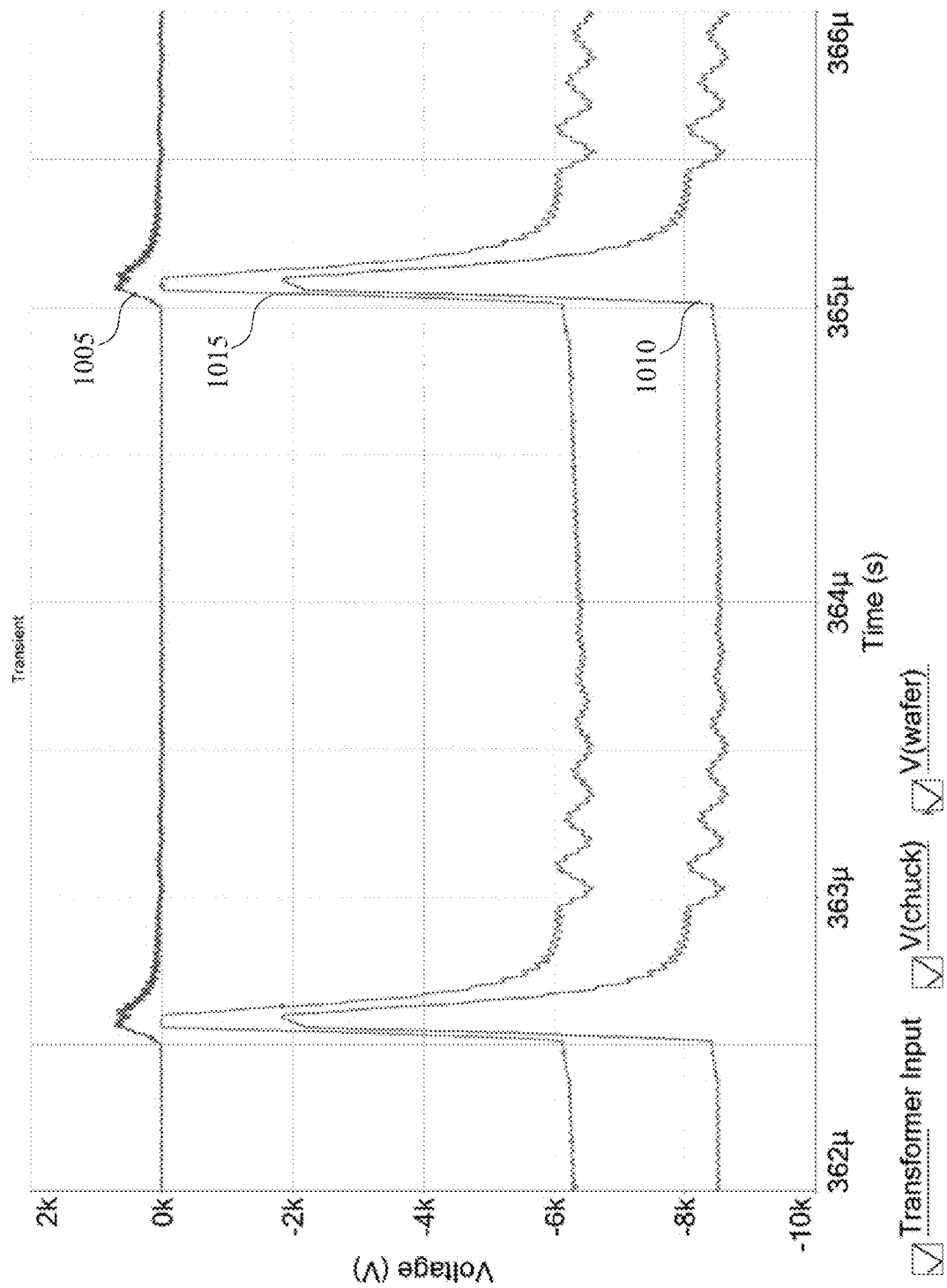
FIG. 10 are waveforms produced by a nanosecond pulser system.

FIG. 10 illustrates a waveform 1005 of the voltage at the input to the transformer T1, a waveform 1010 of the voltage at the chuck (the point labeled 121), and a waveform of the voltage at the wafer (the point labeled 122) using the nanosecond pulser system 900.

In some embodiments, the chucking potential is shown as negative, however, the chucking potential could also be positive.

FIG. 11 is a block diagram of a high voltage switch 1100 with isolated power according to some embodiments. The high voltage switch 1100 may include a plurality of switch modules 1105 (collectively or individually 1105, and individually 1105A, 1105B, 1105C, and 1105D) that may switch voltage from a high voltage source 1160 with fast rise times and/or high frequencies and/or with variable pulse widths. Each switch module 1105 may include a switch 1110 such as, for example, a solid state switch.

In some embodiments, the switch 1110 may be electrically coupled with a gate driver circuit 1130 that may include a power supply 1140 and/or an isolated fiber trigger 1145 (also referred to as a gate trigger or a switch trigger). For example, the switch 1110 may include a collector, an emitter, and a gate (or a drain, a source, and a gate) and the power supply 1140 may drive the gate of the switch 1110 via the gate driver circuit 1130. The gate driver circuit 1130 may, for example, be isolated from the other components of the high voltage switch 1100.

In some embodiments, the power supply 1140 may be isolated, for example, using an isolation transformer. The isolation transformer may include a low capacitance transformer. The low capacitance of the isolation transformer may, for example, allow the power supply 1140 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 1100. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 1140 may include any type of power supply that can provide high voltage standoff (isolation) or have low capacitance (e.g., less than about 1,000 pF, 100 pF, 10 pF, etc.). In some embodiments, the control voltage power source may supply 1120 VAC or 240 VAC at 60 Hz.

In some embodiments, each power supply 1140 may be inductively electrically coupled with a single control voltage power source. For example, the power supply 1140A may be electrically coupled with the power source via a first transformer; the power supply 1140B may be electrically coupled with the power source via a second transformer; the power supply 1140C may be electrically coupled with the power source via a third transformer; and the power supply 1140D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 1140A, the power supply 1140B, the power supply 1140C, and/or the power supply 1140D may not share a return reference ground or a local ground.

The isolated fiber trigger 1145, for example, may also be isolated from other components of the high voltage switch 1100. The isolated fiber trigger 1145 may include a fiber optic receiver that allows each switch module 1105 to float relative to other switch modules 1105 and/or the other components of the high voltage switch 1100, and/or, for example, while allowing for active control of the gates of each switch module 1105.

In some embodiments, return reference grounds or local grounds or common grounds for each switch module 1105, for example, may be isolated from one another, for example, using an isolation transformer.

Electrical isolation of each switch module 1105 from common ground, for example, can allow multiple switches to be arranged in a series configuration for cumulative high voltage switching. In some embodiments, some lag in switch module timing may be allowed or designed. For example, each switch module 1105 may be configured or rated to switch 1 kV, each switch module may be electrically isolated from each other, and/or the timing of closing each switch module 1105 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 1110 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 1110 may include any type of solid state switching device such as, for example, an IGBT, a MOSFET, a SiC MOSFET, SiC junction transistor, FETs, SiC switches, GaN switches, photoconductive switch, etc. The switch 1110, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns) and/or with long pulse lengths (e.g., greater than about 10 ms). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 1100 shown in FIG. 11 includes four switch modules 1105. While four are shown in this figure, any number of switch modules 1105 may be used such as, for example, two, eight, twelve, sixteen, twenty, twenty-four, etc. For example, if each switch in each switch module 1105 is rated at 1100 V, and sixteen switches are used, then the high voltage switch can switch up to 19.2 kV. As another example, if each switch in each switch module 1105 is rated at 1700 V, and sixteen switches are used, then the high voltage switch can switch up to 27.2 kV.

In some embodiments, the high voltage switch 1100 may switch voltages greater than 5 kV, 10 kV, 11 kV, 20 kV, 25 kV, etc.

In some embodiments, the high voltage switch 1100 may include a fast capacitor 1155. The fast capacitor 1155, for example, may include one or more capacitors arranged in series and/or in parallel. These capacitors may, for example, include one or more polypropylene capacitors. The fast capacitor 1155 may store energy from the high voltage source 1160.

In some embodiments, the fast capacitor 1155 may have low capacitance. In some embodiments, the fast capacitor 1155 may have a capacitance value of about 1 µF, about 5 µF, between about 1 µF and about 5 µF, between about 100 nF and about 1,000 nF etc.

In some embodiments, the high voltage switch 1100 may or may not include a crowbar diode 1150. The crowbar diode 1150 may include a plurality of diodes arranged in series or in parallel that may, for example, be beneficial for driving inductive loads. In some embodiments, the crowbar diode 1150 may include one or more Schottky diodes such as, for example, a silicon carbide Schottky diode. The crowbar diode 1150 may, for example, sense whether the voltage from the switches of the high voltage switch is above a certain threshold. If it is, then the crowbar diode 1150 may short the power from switch modules to ground. The crowbar diode, for example, may allow an alternating current path to dissipate energy stored in the inductive load after switching. This may, for example, prevent large inductive voltage spikes. In some embodiments, the crowbar diode 1150 may have low inductance such as, for example, 1 nH, 10 nH, 100 nH, etc. In some embodiments, the crowbar diode 1150 may have low capacitance such as, for example, 100 pF, 1 nF, 10 nF, 100 nF, etc.

In some embodiments, the crowbar diode 1150 may not be used such as, for example, when the load 1165 is primarily resistive.

In some embodiments, each gate driver circuit 1130 may produce less than about 1000 ns, 100 ns, 10.0 ns, 5.0 ns, 3.0 ns, 1.0 ns, etc. of jitter. In some embodiments, each switch 1110 may have a minimum switch on time (e.g., less than about 10 μs, 1 μs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 1105 may have the same or substantially the same (±5%) stray inductance. Stray inductance may include any inductance within the switch module 1105 that is not associated with an inductor such as, for example, inductance in leads, diodes, resistors, switch 1110, and/or circuit board traces, etc. The stray inductance within each switch module 1105 may include low inductance such as, for example, an inductance less than about 300 nH, 100 nH, 10 nH, 1 nH, etc. The stray inductance between each switch module 1105 may include low inductance such as, for example, an inductance less than about 300 nH, 100 nH, 10 nH, 1 nH, etc.

In some embodiments, each switch module 1105 may have the same or substantially the same (±5%) stray capacitance. Stray capacitance may include any capacitance within the switch module 1105 that is not associated with a capacitor such as, for example, capacitance in leads, diodes, resistors, switch 1110 and/or circuit board traces, etc. The stray capacitance within each switch module 1105 may include low capacitance such as, for example, less than about 1,000 pF, 100 pF, 10 pF, etc. The stray capacitance between each switch module 1105 may include low capacitance such as, for example, less than about 1,000 pF, 100 pF, 10 pF, etc.

Imperfections in voltage sharing can be addressed, for example, with a passive snubber circuit (e.g., the snubber diode 1115, the snubber capacitor 1120, and/or the freewheeling diode 1125). For example, small differences in the timing between when each of the switches 1110 turn on or turn off or differences in the inductance or capacitances may lead to voltage spikes. These spikes can be mitigated by the various snubber circuits (e.g., the snubber diode 1115, the snubber capacitor 1120, and/or the freewheeling diode 1125).

A snubber circuit, for example, may include a snubber diode 1115, a snubber capacitor 1120, a snubber resistor 1116, and/or a freewheeling diode 1125. In some embodiments, the snubber circuit may be arranged together in parallel with the switch 1110. In some embodiments, the snubber capacitor 1120 may have low capacitance such as, for example, a capacitance less than about 100 pF.

In some embodiments, the high voltage switch 1100 may be electrically coupled with or include a load 1165 (e.g., a resistive or capacitive or inductive load). The load 1165, for example, may have a resistance from 50 ohms to 500 ohms. Alternatively or additionally, the load 1165 may be an inductive load or a capacitive load.

In some embodiments, the primary sink 106, the primary sink 206, or the primary sink 406 can decrease the energy consumption of a high voltage nanosecond pulser system and/or the voltage required to drive a given load. For example, the energy consumption can be reduced as much as 10%, 15% 20%, 25%, 30%, 40%, 45%, 50%, etc. or more.

In some embodiments, the diode D4, the diode 110, and/or the diode D6 may comprise a high voltage diode.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The term "or" is inclusive.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage, high frequency switching circuit comprising:
   a high voltage switching power supply that produces pulses having a voltage greater than 1 kV and with frequencies greater than 10 kHz;
   a transformer having a primary side and secondary side;
   an output electrically coupled with the secondary side of the transformer; and
   a primary sink electrically coupled with the primary side of the transformer and electrically coupled with ground, the primary sink comprising at least one resistor that discharges a load coupled with the output;
   wherein the load is capacitive in nature with a capacitance less than 50 nF, wherein the load capacitance does not hold charges for times greater than 10 μs.

2. The high voltage, high frequency switching circuit according to claim 1, wherein the primary sink is configured to dissipate over about 1 kilowatt of average power.

3. The high voltage, high frequency switching circuit according to claim 1, wherein the primary sink comprises at least on inductor in series with the at least one resistor.

4. The high voltage, high frequency switching circuit according to claim 1, wherein the primary sink comprises a switch in series with the at least one resistor.

5. He high voltage, high frequency switching circuit according to claim 1, wherein the output is coupled with a plasma load that is capacitive.

6. The high voltage, high frequency switching circuit according to claim 1, wherein the output is coupled with a plasma load that includes a dielectric barrier discharge.

7. The high voltage, high frequency switching circuit according to claim 1, wherein the resistance of the resistor in the primary sink has a value less than about 400 ohms.

8. The high voltage, high frequency switching circuit according to claim 1, wherein the high voltage high frequency switching power supply delivers peak powers greater than 100 kW.

9. The high voltage, high frequency switching circuit according to claim 1, wherein the resistor in the primary sink includes a resistance R and the output is coupled with a load having a capacitance C such that $$R \approx \frac{t_f}{a^2 C}$$

where $t_f$ is the pulse fall time.

10. The high voltage, high frequency switching circuit according to claim 1, wherein the load is capacitive in nature and the high voltage, high frequency switching circuit rapidly charges the load capacitance and discharges the load capacitance.

11. The high voltage, high frequency switching circuit according to claim 1, wherein the output produces a negative bias voltage within a plasma of greater than −2 kV when the high voltage switching power supply is not providing a high voltage pulse.

12. The high voltage, high frequency switching circuit according to claim 1, wherein the output can produce a high voltage pulse having a voltage greater than 1 kV and with frequencies greater than 10 kHz with pulse fall times less than about 400 ns.

13. A high voltage, high frequency switching circuit comprising:
   a high voltage switching power supply that produces pulses having a voltage greater than 1 kV and with frequencies greater than 10 kHz;
   a transformer having a primary side and secondary side;
   an output electrically coupled with the secondary side of the transformer; and
   a primary sink electrically coupled to the primary side of the transformer and electrically coupled with ground the primary sink comprising at least one resistor that discharges a load coupled with the output and at least one inductor in series with the at least one resistors;
   wherein the load is capacitive in nature with a capacitance less than 50 nF, wherein the load capacitance does not hold charges for times greater than 10 μs.

14. The high voltage, high frequency switching circuit according to claim 13, wherein the primary sink comprises a switch in series with the at least one resistor and/or the at least one inductor.

15. The high voltage, high frequency switching circuit according to claim 13, wherein the output can produce a high voltage pulse having a voltage greater than 1 kV and with frequencies greater than 10 kHz and with a pulse fall time less than about 400 ns.

16. The high voltage, high frequency switching circuit according to claim 13, wherein the primary sink is configured to dissipate over about 1 kilowatt of power.

17. The high voltage, high frequency switching circuit according to claim 13, wherein the high voltage switching power supply comprises a power supply, at least one switch, and a step-up transformer.

18. The high voltage, high frequency switching circuit according to claim 13, wherein the primary sink handles a peak power greater than 10 kW.

19. The high voltage, high frequency switching circuit according to claim 13, wherein the primary sink includes an inductor and a resistor, and wherein the inductance L of the inductor and the resistance R of the resistor are set to satisfy L/R≈tp, where tp is the pulse width of the pulse.

20. The high voltage, high frequency switching circuit according to claim 13, wherein the resistor in the primary sink includes a resistance R and the output is coupled with a load having a capacitance C such that $$R \approx \frac{t_f}{a^2 C}$$

where $t_f$ is the pulse fall time.

21. A high voltage, high frequency switching circuit comprising:
   a high voltage switching power supply that produces pulses having a voltage greater than 1 kV and with frequencies greater than 10 kHz;
   a transformer having a primary side and secondary side;
   an output electrically coupled with the secondary side of the transformer; and
   a primary sink electrically coupled with the primary side of the transformer and electrically coupled with ground, the primary sink comprising at least one resistor that discharges a load coupled with the output, wherein the at least one resistor includes a resistance R and the output is coupled with a load having a capacitance C such that $$R \approx \frac{t_f}{a^2 C}$$

where $t_f$ is the pulse fall time.

22. A high voltage, high frequency switching circuit comprising:
   a high voltage switching power supply that produces pulses having a voltage greater than 1 kV and with frequencies greater than 10 kHz;
   a transformer having a primary side and secondary side;
   an output electrically coupled with the secondary side of the transformer; and
   a primary sink electrically coupled with the primary side of the transformer and electrically coupled with ground, the primary sink comprising at least one resistor that discharges a load coupled with the output;
   wherein the output produces a negative bias voltage within a plasma of greater than −2 kV when the high voltage switching power supply is not providing a high voltage pulse.

* * * * *